United States Patent
Han

(10) Patent No.: US 10,691,346 B2
(45) Date of Patent: Jun. 23, 2020

(54) READ OPERATION METHOD OF NONVOLATILE MEMORY, MEMORY SYSTEM INCLUDING THE NONVOLATILE MEMORY, AND OPERATION METHOD OF THE MEMORY SYSTEM

(71) Applicant: Samsung Electronics Co., Ltd., Suwon-si, Gyeonggi-do (KR)

(72) Inventor: Il-su Han, Incheon (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 90 days.

(21) Appl. No.: 15/846,473

(22) Filed: Dec. 19, 2017

(65) Prior Publication Data
US 2018/0173432 A1   Jun. 21, 2018

(30) Foreign Application Priority Data
Dec. 19, 2016 (KR) .................. 10-2016-0173623

(51) Int. Cl.
| | |
|---|---|
| *G06F 11/07* | (2006.01) |
| *G06F 3/06* | (2006.01) |
| *G11C 7/00* | (2006.01) |
| *G11C 11/56* | (2006.01) |
| *G06F 11/10* | (2006.01) |
| *G11C 16/34* | (2006.01) |

(52) U.S. Cl.
CPC .......... *G06F 3/0611* (2013.01); *G06F 3/0634* (2013.01); *G06F 3/0658* (2013.01); *G06F 3/0673* (2013.01); *G06F 11/073* (2013.01); *G06F 11/0793* (2013.01); *G06F 11/1068* (2013.01); *G11C 7/00* (2013.01); *G11C 11/5642* (2013.01); *G11C 16/349* (2013.01)

(58) Field of Classification Search
None
See application file for complete search history.

(56) References Cited

U.S. PATENT DOCUMENTS

| | | | |
|---|---|---|---|
| 7,672,161 B2 | 3/2010 | Hou et al. | |
| 8,289,781 B2 | 10/2012 | Litsyn et al. | |
| 8,576,624 B2 | 11/2013 | Dutta et al. | |
| 8,953,373 B1 | 2/2015 | Wu et al. | |
| 9,047,955 B2 | 6/2015 | Cometti et al. | |
| 9,135,109 B2 | 9/2015 | Ghaly et al. | |
| 9,280,419 B2 | 3/2016 | Chunn et al. | |
| 9,368,225 B1 | 6/2016 | Pinkovich et al. | |
| 10,276,233 B1 * | 4/2019 | Danjean | G11C 11/5642 |

(Continued)

FOREIGN PATENT DOCUMENTS

CN  102831026 A  12/2012

*Primary Examiner* — Douglas King
(74) *Attorney, Agent, or Firm* — Harness, Dickey & Pierce, P.L.C.

(57) ABSTRACT

A read operation method of a nonvolatile memory includes selecting at least a first selection defence code from among a plurality of defence codes by using read voltage level determination information and read environment information, the read environment information including values respectively corresponding to a plurality of factors; determining a level of a read voltage for performing a read operation based on the first selection defence code; and performing the read operation by using the read voltage having the determined level.

20 Claims, 28 Drawing Sheets

(56) References Cited

U.S. PATENT DOCUMENTS

| | | | |
|---|---|---|---|
| 2009/0067266 A1* | 3/2009 | Roohparvar | G11C 16/20 365/189.16 |
| 2010/0091535 A1 | 4/2010 | Sommer et al. | |
| 2011/0044101 A1* | 2/2011 | Chou | G11C 11/5642 365/185.03 |
| 2012/0134213 A1* | 5/2012 | Choi | G11C 7/04 365/185.18 |
| 2013/0024742 A1 | 1/2013 | Nazarian et al. | |
| 2013/0094290 A1* | 4/2013 | Sridharan | G11C 16/0483 365/185.03 |
| 2014/0229131 A1 | 8/2014 | Cohen et al. | |
| 2015/0324691 A1 | 11/2015 | Dropps et al. | |
| 2016/0148702 A1* | 5/2016 | Karakulak | G11C 16/26 365/185.12 |
| 2017/0109040 A1* | 4/2017 | Raghu | G06F 3/061 |

* cited by examiner

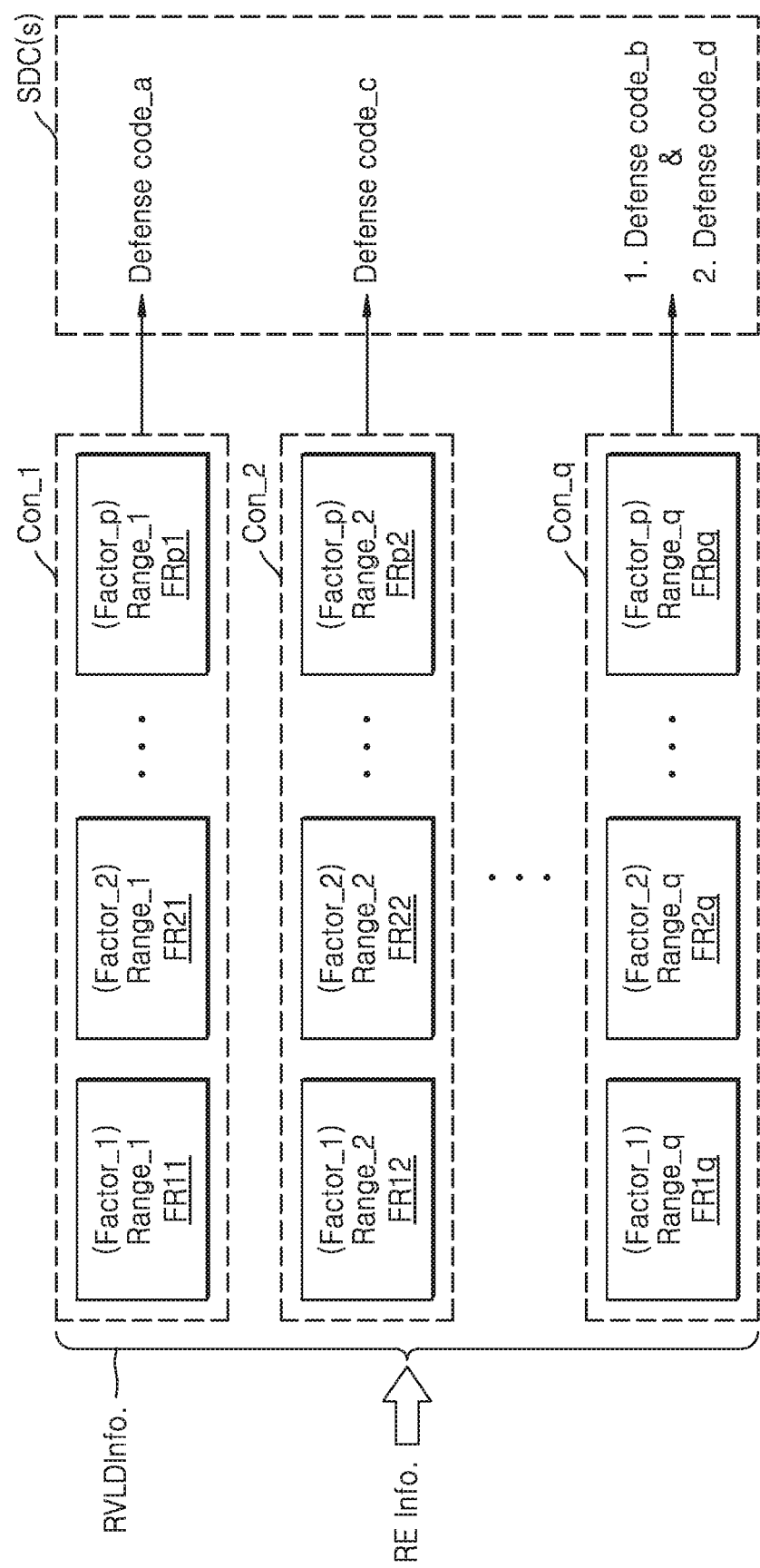

READ OPERATION METHOD OF
NONVOLATILE MEMORY, MEMORY
SYSTEM INCLUDING THE NONVOLATILE
MEMORY, AND OPERATION METHOD OF
THE MEMORY SYSTEM

CROSS-REFERENCE TO RELATED
APPLICATION

This application claims the benefit of Korean Patent Application No. 10-2016-0173623, filed on Dec. 19, 2016, in the Korean Intellectual Property Office, the disclosure of which is incorporated herein in its entirety by reference.

BACKGROUND

1. Field

At least some example embodiments of the inventive concepts relate to a read operation method of a nonvolatile memory, and more particularly, to a memory system including a nonvolatile memory and an operation method of the memory system.

2. Related Art

Defence codes are used to determine an optimum or, alternatively, desirable level of a read voltage according to a change in a threshold voltage distribution of nonvolatile memory cells during a read operation of a nonvolatile memory. However, since the optimum or, alternatively, desirable level of the read voltage is determined by using all of the plurality of defence codes in a given order, it takes a long time and the performance of a memory system including the nonvolatile memory is reduced.

SUMMARY

According to at least some example embodiments of the inventive concepts, a read operation method of a nonvolatile memory includes selecting at least a first selection defence code from among a plurality of defence codes by using read voltage level determination information and read environment information, the read environment information including values respectively corresponding to a plurality of factors; determining a level of a read voltage for performing a read operation based on the first selection defence code; and performing the read operation by using the read voltage having the determined level.

According to at least some example embodiments of the inventive concepts, an operation method of a memory system comprising a memory device and a memory controller for controlling the memory device includes collecting, by the memory controller from the memory device, read environment information comprising values respectively corresponding to a plurality of factors in response to a read request received from outside of the memory controller; selecting, by the memory controller, at least one selection defence code from among a plurality of defence codes by using read voltage level determination information and the read environment information; determining, by the memory controller, a level of a read voltage by controlling the memory device based on the at least one selection defence code; and controlling, by the memory controller, a read operation on the memory device based on a result of a read voltage level determination operation, wherein the controlling is performed by the memory controller.

According to at least some example embodiments of the inventive concepts, a memory controller for controlling a memory operation on a memory device includes a memory configured to store programs related to defence code selection and read voltage level determination information; and a processor connected to the memory and configured to execute the programs stored in the memory in order to select at least one selection defence code from among a plurality of defence codes by using the read voltage level determination information and read environment information comprising values respectively corresponding to a plurality of factors collected from the memory device, in response to a read request received from outside of the processor.

According to at least some example embodiments of the inventive concepts, a method of operating a memory controller includes selecting, at the memory controller, a defence code from among a plurality of defence codes as a selected defence code, based on one or more factors associated with a memory device, the plurality of defence codes corresponding to a plurality of read voltage level determination operations, respectively; determining a read voltage level by performing the read voltage level determination operation corresponding to the selected defence code; and performing a read operation on a plurality of memory cells of the memory device using a read voltage having the determined read voltage level.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIGS. 10A through 10C are diagrams for explaining a method of selecting at least one from among a plurality of defence codes as a selection defence code according to at least one example embodiment of the inventive concepts;

DETAILED DESCRIPTION OF THE EMBODIMENTS

Figure 1:
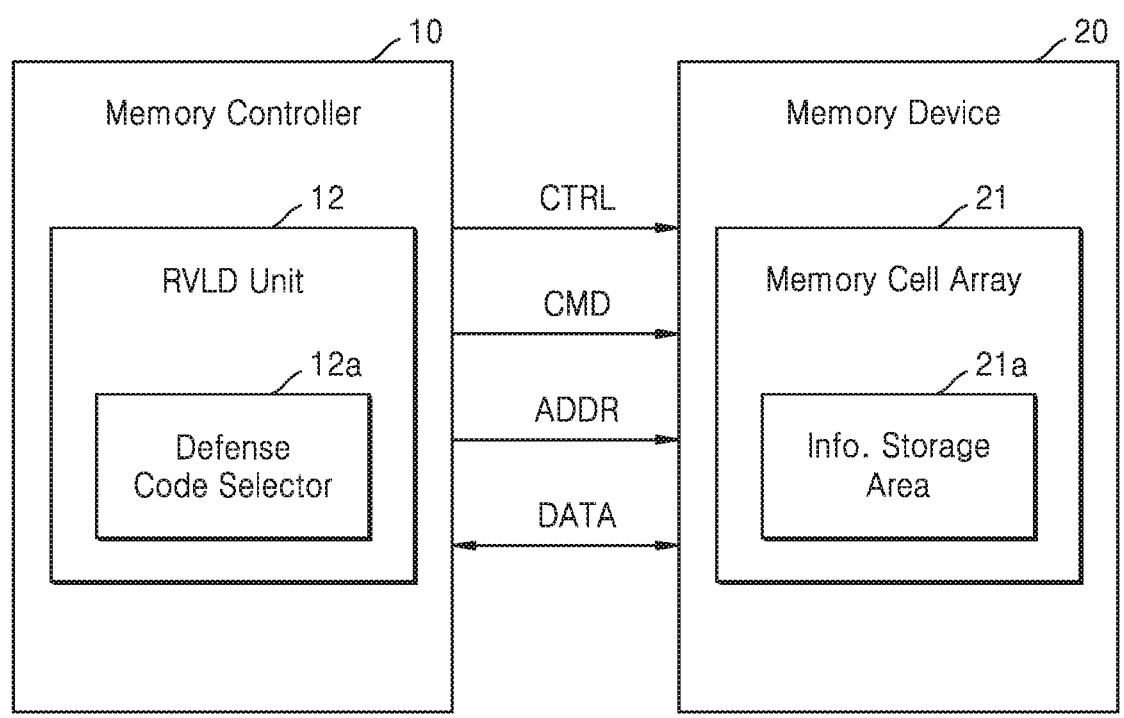
FIG. 1 is a block diagram of a memory system according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a memory system 1 according to at least one example embodiment of the inventive concepts.

Referring to FIG. 1, the memory system 1 may include a memory controller 10 and a memory device 20. The memory controller 10 may include a read voltage level determination (RVLD) unit 12. The memory device 20 may include a memory cell array 21. The memory controller 10 may control a memory operation on the memory device 20. In detail, the memory controller 10 may control program, read, and erase operations on the memory device 20 by providing an address ADDR, a command CMD, and a control signal CTRL to the memory device 20.

The RVLD unit 12 according to at least one example embodiment of the inventive concepts may include a defence code selector 12a. When the memory controller 10 controls a read operation on the memory device 20, the RVLD unit 12 may determine a level of a read voltage needed to perform the read operation on the memory device 20. The defence code selector 12a may select at least one selection defence code from among a plurality of defence codes by using read environment information and read voltage level determination information of the memory device 20. The term 'defence code' refers to a code executed by the RVLD unit 12 (or the memory controller 10) in order to determine an optimum or, alternatively, desirable level of a read voltage for memory cells included in the memory cell array 21. For example, according to at least some example embodiments of the inventive concepts, the defence code is a kind of machine code that is executed by a processor to determine an ideal or, alternatively, desirable, read voltage. Although the memory controller 10 includes the RVLD unit 12 in FIG. 1, at least some example embodiments of the inventive concepts are not limited thereto and the memory controller 10 may function as the RVLD unit 12.

According to at least one example embodiment of the inventive concepts, the defence code selector 12a may select two or more selection defence codes that are bases for determination of a level of a read voltage, and furthermore, may determine a priority order in which the selection defence codes are executed. For example, when the defence code selector 12a selects an a-defence code and a b-defence code, the RVLD unit 12 may determine a priority order so that the a-defence code is executed and then the b-defence code is executed. Also, the RVLD unit 12 may perform a first operation of determining a level of a read voltage based on the a-defence code and then may perform a second operation of determining a level of a read voltage by using a result of the first operation based on the b-defence code. That is, when two or more associated defence codes are selected as selection defence codes and one defence code is executed, the RVLD unit 12 may determine a level of a read voltage by using a result of an operation according to another defence code that is previously executed.

The RVLD unit 12 may perform a function and an operation for determining a level of a read voltage in accordance with at least some example embodiments of the inventive concepts. According to at least one example embodiment of the inventive concepts, the RVLD unit 12 may include or be implemented by one or more circuits or circuitry (e.g., hardware) specifically structured to carry out and/or control some or all of the operations described in the present disclosure as being performed by the RVLD unit 12 (or an element thereof). According to at least one example embodiment of the inventive concepts, the RVLD unit 12 may include or be implemented by a memory and one or more processors executing computer-readable code (e.g., software and/or firmware) that is stored in the memory and includes instructions for causing the one or more processors to carry out and/or control some or all of the operations described herein as being performed by the RVLD unit 12 (or an element thereof). According to at least one example embodiment of the inventive concepts, the RVLD unit 12 may be implemented by, for example, a combination of the above-referenced hardware and one or more processors executing computer-readable code.

Since a threshold voltage distribution gradually varies according to characteristics of the memory cells, in order to read data programmed to the memory cells, an optimum or, alternatively, desirable level of a read voltage has to be determined in consideration of a change in the threshold voltage distribution. Accordingly, the RVLD unit 12 may determine a level of a read voltage needed to perform a read operation based on a selection defence code selected by the defence code selector 12a.

The memory cell array 21 may include the plurality of memory cells (not shown) arranged at intersections between a plurality of word lines (not shown) and a plurality of bit lines (not shown). According to at least one example embodiment of the inventive concepts, the plurality of memory cells may be flash memory cells, and the memory cell array 21 may be a NAND flash memory cell array or a NOR flash memory cell array. The following will now be explained on the assumption that the plurality of memory cells are flash memory cells. However, at least some example embodiments of the inventive concepts are not limited thereto, and in another embodiment, the plurality of memory cells may include resistive memory cells such as resistive random-access memory (RRAM) cells, phase-change random-access memory (PRAM) cells, or magnetic random-access memory (MRAM) cells.

The memory cell array 21 may include an information storage area 21a that stores read environment information and read voltage level determination information of the memory device 20. However, at least some example embodiments of the inventive concepts are not limited thereto, and the read environment information and the read voltage level determination information may be stored in an internal memory (not shown) of the memory controller 10. The read environment information may be information about factors that have to be considered during a read operation on the memory device 20 when the memory controller 10 controls the read operation on the memory device 20. Also, the read voltage level determination information may include information about at least one defence code mapped according to a value of each of values of the factors included in the read environment information, and is used in order for the defence code selector 12a to select at least one selection defence code from among a plurality of defence codes. The read voltage level determination information may be generated as a result of a predetermined or, alternatively, desired training operation. At least one example of the predetermined or, alternatively, desired training operation including a plurality of loop operations is illustrated FIG. 9 and discussed in greater detail below.

The read environment information and the read voltage level determination information stored in the information storage area 21a may be loaded to the memory controller 10, and may be stored in the internal memory included in the memory controller 10.

The RVLD unit 12 may determine a level of a read voltage needed to perform a read operation on the memory device 20 based on at least one selection defence code selected by the defence code selector 12a. Once the level of the read voltage is determined, the memory controller 10 may control a read operation on the memory device 20 by using a read voltage having the determined level (e.g., the determined read voltage level). Also, the RVLD unit 12 may modify the read voltage level determination information based on a result of a read voltage level determination operation. Next, the modified read voltage level determination information may be backed up in the memory device 20 periodically or before the memory system 1 is turned off.

As such, since only at least one selection defence code selected by using read environment information and read voltage level determination information is used, without using all of a plurality of defence codes, in order to determine a level of a read voltage needed to perform a read operation according to at least one example embodiment of the inventive concepts, the read performance of the memory system 1 may be improved.

Figure 2:
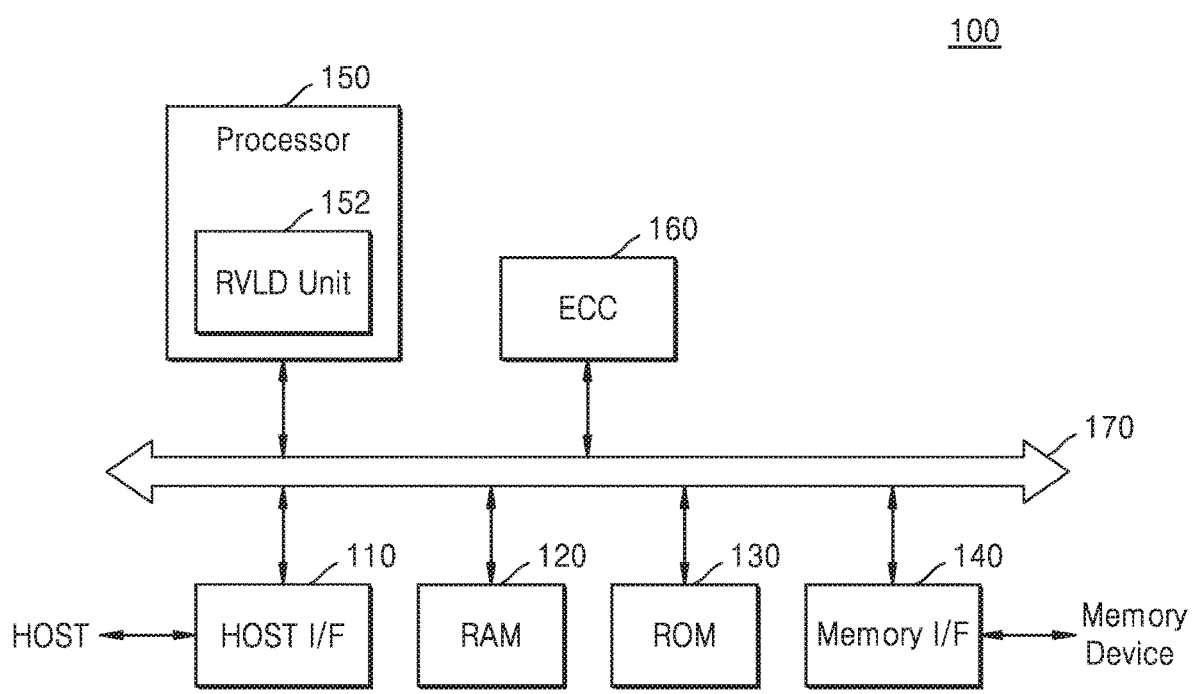
FIG. 2 is a block diagram of a memory controller according to at least one example embodiment of the inventive concepts.

FIG. 2 is a block diagram of a memory controller 100 according to at least one example embodiment of the inventive concepts.

Referring to FIG. 2, the memory controller 100 may include a host interface 110, a random-access memory (RAM) 120, a read-only memory (ROM) 130, a memory interface 140, a processor 150, an error correction circuit 160, and a bus 170. The processor 150 may be electrically connected to the host interface 110, the RAM 120, the ROM 130, the memory interface 140, and the error correction circuit 160 via the bus 170. The bus 170 may refer to a path through which information is transmitted between elements of the memory controller 100. The processor 150 may control an overall operation of the memory system 1 of FIG. 1. In detail, the processor 150 may decode a command received from a host HOST and may control the memory system 1 to perform an operation according to a result of the decoding.

The host interface 110 includes a data exchange protocol for exchanging data with the host HOST and connects a memory device and the host HOST. Examples of the host interface 110 may include an advanced technology attachment (ATA) interface, a serial advanced technology attachment (SATA) interface, a parallel advanced technology attachment (PATA) interface, a universal serial bus (USB) or serial attached small computer system (SAS) interface, a small computer system interface (SCSI), an embedded multimedia card (eMMC) interface, and a unix file system (UFS) interface. The host interface 110 may exchange a command, an address, and data with the host HOST under the control of the processor 150.

The memory interface 140 may be configured to interface with the memory device. The memory interface 140 may be configured to selectively perform software and hardware interleave operations through a plurality of channels.

The error correction circuit 160 may correct an error of data read from the memory device. Also, examples of an error correction method performed by the error correction circuit 160 may include a hard decision method and a soft decision method.

The processor 150 may include an RVLD unit 152. Data generated by the processor 150 and data transmitted from the host HOST may be temporarily stored in the RAM 120 and the ROM 130, or data read from the memory device may be temporarily stored in the RAM 120 or the ROM 130. Also, the RVLD unit 152 may collect read environment information and read voltage level determination information from the information storage area 21a of FIG. 1, and the collected information may be stored in the RAM 120 and the ROM 130.

When the host interface 110 receives a read request from the host HOST, the RVLD unit 152 may determine a level of a read voltage needed to perform a read operation on the memory device in response to the read request. According to at least one example embodiment of the inventive concepts, the RVLD unit 152 may select at least one from among a plurality of defence codes as a first selection defence code by using the read environment information and the read voltage level determination information stored in the RAM 120 or the ROM 130. The plurality of defence codes may be stored in the RAM 120 or the ROM 130, and the RVLD unit 152 may determine a level of a read voltage by executing at least one first selection defence code from among the plurality of defence codes stored in the ROM 130.

According to at least one example embodiment of the inventive concepts, the RVLD unit 152 may predict a result of a read operation on the memory device by using the read environment information and the read voltage level determination information. When it is predicted that the read operation is to fail, the RVLD unit 152 may determine that a general read operation on the memory device is to be minimally performed, and the error correction circuit 160 may perform an error correction operation after the general read operation to obtain error-corrected read data from the memory device. For example, when a defence code that is a basis for determination of a level of a read voltage may not be selected from among the plurality of defence codes by using the read environment information and the read voltage level determination information, the RVLD unit 152 may predict that the read operation on the memory device is to fail. In this case, the processor 150 may skip read operations on the memory device based on a result of the predicting, and may directly control the error correction circuit 160 to perform an error correction operation.

According to at least one example embodiment of the inventive concepts, the RVLD unit 152 may select at least one second selection defence code from among the plurality of defence codes by using the read environment information and the read voltage level determination information in order to determine a level of a read voltage related to a hard decision method or a soft decision method needed for the error correction circuit 160 to perform an error correction operation. The RVLD unit 152 may determine a level of a read voltage needed to perform an error correction operation based on the second selection defence code. As such, the read voltage level determination information may include selection information about the first selection defence code that is a basis for determination of a level of a read voltage needed to perform a general read operation and selection information about the second selection defence code that is a basis for determination of a level of a read voltage needed to perform an error correction operation.

As such, the RVLD unit 152 according to at least one example embodiment of the inventive concepts may efficiently perform a read operation and an error correction operation by selecting and executing a minimum or, alternatively, reduced number of defence codes in order to determine a level of a read voltage needed to perform a read operation and to determine a level of a read voltage needed to perform an error correction operation.

Figure 3:
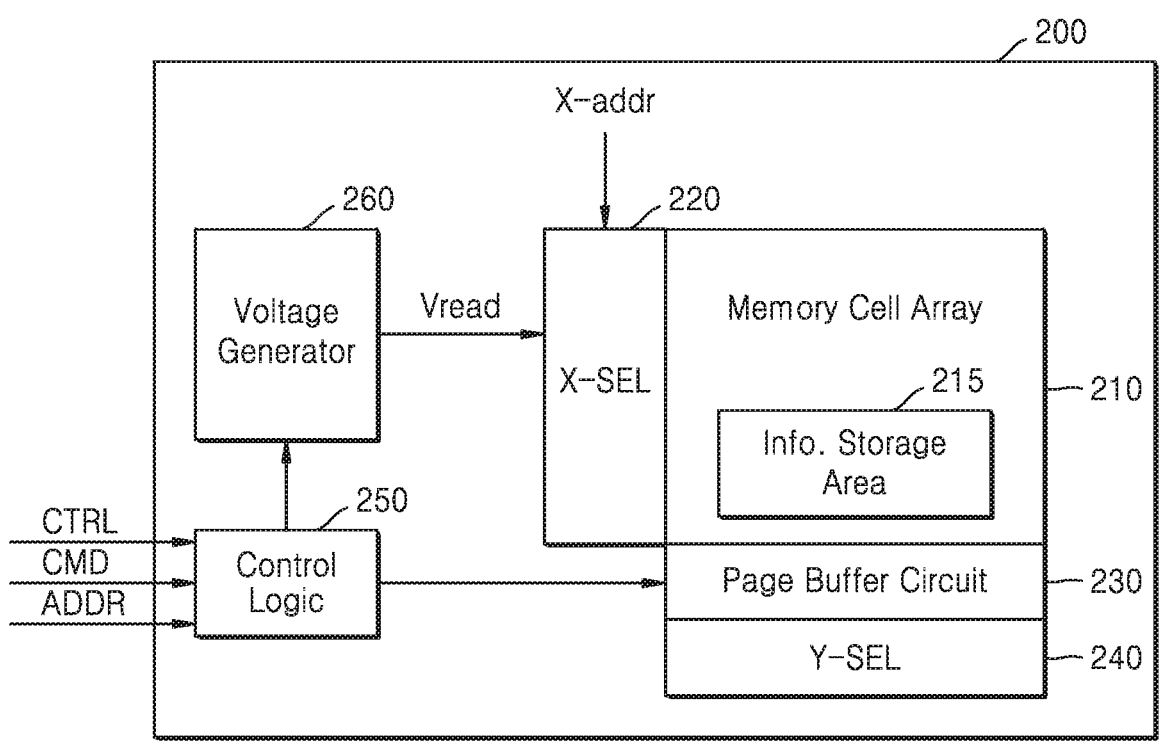
FIG. 3 is a block diagram of a memory device according to at least one example embodiment of the inventive concepts.

FIG. 3 is a block diagram of a memory device 200 according to at least one example embodiment of the inventive concepts.

Referring to FIG. 3, the memory device 200 may include a memory cell array 210, a row selection circuit X-SEL 220, a page buffer circuit 230, a column selection circuit Y-SEL 240, a control logic 250, and a voltage generator 260.

The memory cell array 210 may include a plurality of nonvolatile memory cells, and may include an information storage area 215 in which read environment information and read voltage level determination information are stored. General user data or main data may be stored in the memory cell array 210, and metadata needed to drive the memory device 200 in addition to user data may also be stored in the memory cell array 210.

The page buffer circuit 230 is connected to the memory cell array 210 through a plurality of bit lines BL0 through BLn−1. The page buffer circuit 230 may operate as a write driver for temporarily storing data to be written to memory cells connected to a selected word line or as a sense amplifier for sensing and amplifying data to be read from the memory cells connected to the selected word line.

The control logic 250 may control various operations including a program operation, a read operation, and an erase operation of the memory device 200. The voltage generator 260 may generate word line voltages (e.g., a program voltage Vpgm, a read voltage Vread, and a pass voltage Vpass) to be supplied to word lines according to an operation mode and a voltage to be supplied to a bulk (e.g., a well region) in which memory cells are formed. A voltage generating operation of the voltage generator 260 may be controlled by the control logic 250.

According to at least one example embodiment of the inventive concepts, when the RVLD unit 12 of FIG. 1 executes a selection defence code, the RVLD unit 12 may provide a control signal CTRL, a command CMD, and an address ADDR to the control logic 250 based on the selection defence code. The control logic 250 may determine a level of a read voltage by controlling the memory device 200 in response to the control signal CTRL, the command CMD, and the address ADDR based on the selection defence code. Next, the control logic 250 may control the voltage generator 260 to generate a read voltage having the level determined during a read operation on the memory device 200.

The row selection circuit X-SEL 220 may select one from among memory blocks (or sectors) of the memory cell array 210 and may select one from among word lines of the selected memory block under the control of the control logic 250. The row selection circuit X-SEL 220 may apply a word line voltage generated by the voltage generator 260 to he selected word line and non-selected word lines under the control of the control logic 250.

The column selection circuit Y-SEL 240 may output read data from the page buffer circuit 230 to the outside (e.g., a memory controller or a host) in response to column address information during a read operation.

Figure 4:
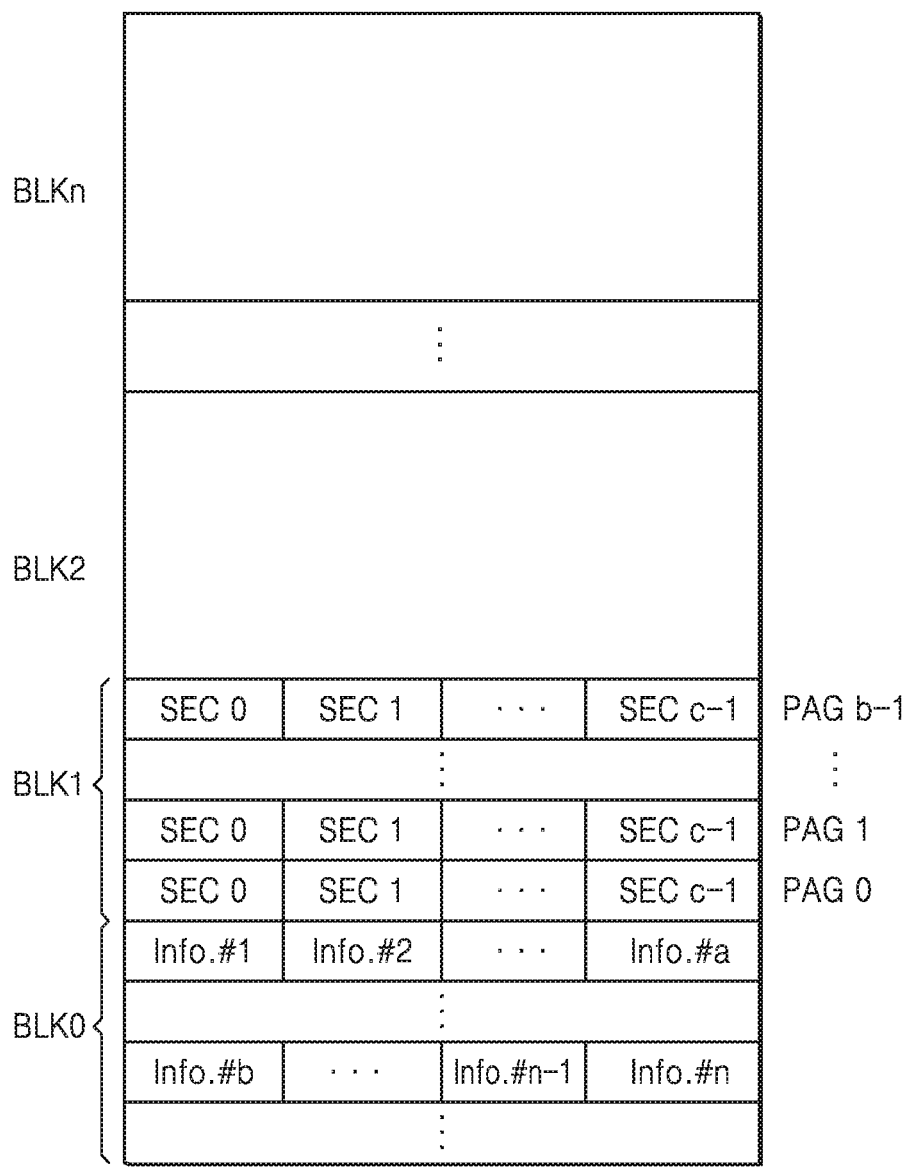
FIG. 4 is a block diagram of a memory cell array included in a memory device according to at least one example embodiment of the inventive concepts.

FIG. 4 is a block diagram of the memory cell array 21 included in the memory device 20 according to at least one example embodiment of the inventive concepts.

Referring to FIG. 4, the memory cell array 21 may be a flash memory cell array. In this case, the memory cell array 21 may include a (a is an integer equal to or greater than 2) blocks BLK0 through BLKn, each of the blocks BLK0 through BLKn may include b (b is an integer equal to or greater than 2) pages PAG0 through PAGb−1, and each of the pages PAG0 through PAGb−1 may include c (c is an integer equal to or greater than 2) sectors SEC0 through SECc−1. Although the pages PAG0 through PAGb−1 and the sectors SEC0 through SECc−1 of only the block BLK1 are illustrated in FIG. 4 for convenience, each of the other blocks BLK0 and BLK2 through BLKn may have the same structure as that of the block BLK1.

According to at least one example embodiment of the inventive concepts, at least one block BLK0 from among the blocks BLK0 through BLKn may store pieces of information Info. #1 through Info. # n including read environment information and read voltage level determination information about the blocks BLK1 through BLKn as the information storage area 215 of FIG. 3. The pieces of information Info. #1 through Info. # n may respectively correspond to the blocks BLK1 through BLKn. For example, the block BLK1 may correspond to the information Info. #1 and the block BLKn may correspond to the information Info. # n. Accordingly, the memory controller 10 of FIG. 1 may refer to the information Info. #1 when data is read from the block BLK1, and furthermore, may determine a level of a read voltage by using the information Info. #1 when data programmed to the block BLK1 is read. However, at least some example embodiments of the inventive concepts are not limited thereto, and the pieces of information Info. #1 through Info. # n may correspond to block groups each including two or more blocks.

Figure 5A:
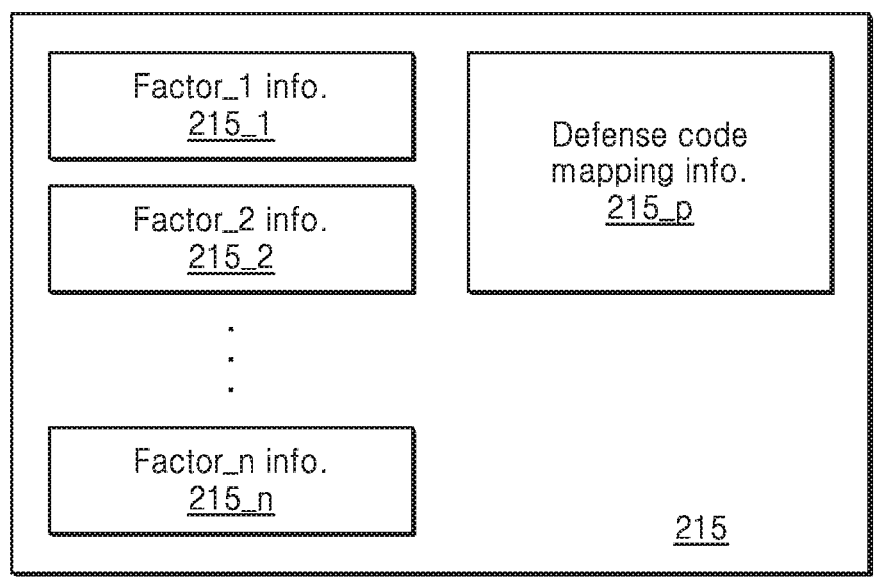
FIGS. 5A through 5C are block diagrams illustrating an information storage area according to at least one example embodiment of the inventive concepts.
Figure 5B:
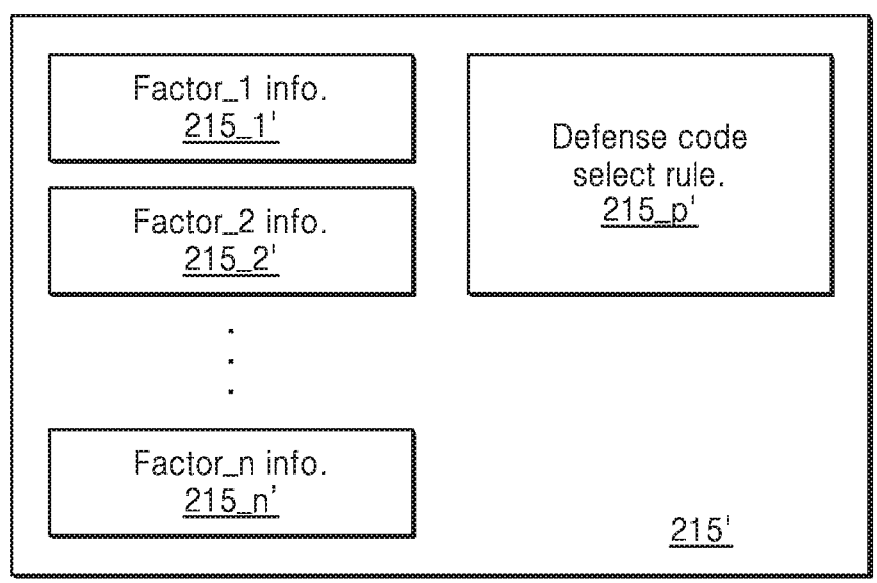
Figure 5C:
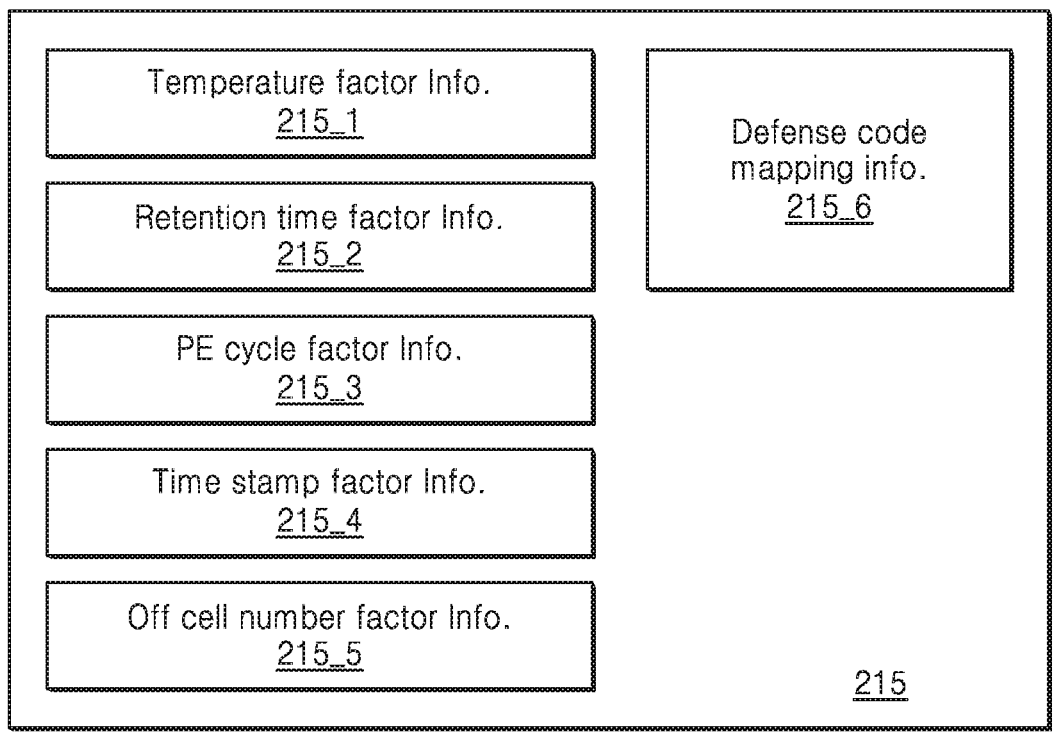

FIGS. 5A through 5C are block diagrams illustrating the information storage area 215 according to at least one example embodiment of the inventive concepts.

Referring to FIG. 5A, the information storage area 215 may store first factor information 215_1 through nth factor information 215_n and defence code mapping information 215_p. Read environment information may include the first factor information 215_1 through the nth factor information 215_n. That is, the first factor information 215_1 through the nth factor information 215_n may indicate values of factors corresponding to causes of a change in a threshold voltage distribution of memory cells. According to at least some example embodiments of the inventive concepts, each factors may be an attribute of a memory device (or system) that impacts threshold voltages of memory cells of the memory device (or system) or impacts a threshold voltage distribution of the memory cells. The first factor information 215_1 through the nth factor information 215_n may be periodically or non-periodically updated respectively by factor information measurers (not shown) in a memory device, and the defence code selector 12a of FIG. 1 may select a selection defence code by using the first factor information 215_1 through the nth factor information 215_n that are newly updated.

Read voltage level determination information may include the defence code mapping information 215_p. The defence code mapping information 215_p may indicate at least one defence code mapped to each of a plurality of read conditions according to various values corresponding to first through nth factors. For example, it may be indicated that a first read condition included in the defence code mapping information 215_p is mapped to a first defence code and a second read condition is mapped to a second defence code. The defence code mapping information 215_p may be generated by performing a read voltage level determination operation of adjusting values of the first through nth factors, selecting at least one defence code from among a plurality of defence codes based on the adjusted values of the first through nth factors, and determining a level of a read voltage based on the selected defence code and by accumulating a result of the read voltage level determination operation.

Referring to FIG. 5B, unlike in FIG. 5A, read voltage level determination information may include a defence code selection rule 215_p', and the information storage area 215 may store the defence code selection rule 215_p'. The defence code selection rule 215_p' may be generated by performing a read voltage level determination operation of adjusting values of the first through nth factors, selecting at least one defence code from among a plurality of defence codes based on the adjusted values of the first through nth factors, and determining a level of a read voltage based on the selected defence code, determining whether the read voltage level determination operation succeeds, and obtaining a result of learning (e.g., deep learning using a neural network) by using a result of the determining whether the read voltage level determination operation succeeds.

Referring to FIG. 5C, the information storage area 215 may store temperature factor information 215_1, retention time factor information 215_2, program/erase (PE) cycle factor information 215_3, time stamp factor information 215_4, off cell number factor information 215_5, and defence code mapping information 215_6. For example, when it is assumed that the information Info. # n corresponds to the block BLKn, the temperature factor information 215_1 may indicate a temperature state when data is programmed to the block BLKn and a temperature state when data is read from the block BLKn. The retention time factor information 215_2 may indicate a retention time of data programmed to the block BLKn. The PE cycle factor information 215_3 may indicate the number of times data is programmed/erased to/from the block BLKn. The time stamp factor information 215_4 may be obtained by counting a time period from a time at which the block BLKn is in a specific state to a current time. The off cell number factor information 215_5 may indicate a threshold voltage distribution of memory cells included in the block BLKn by counting the number of off cells when a read voltage having a predetermined or, alternatively, desired level is applied to programmed memory cells included in the block BLKn.

A temperature factor, a retention time factor, a PE cycle factor, a time stamp factor, and an off cell number factor may be factors for determining a variation in a threshold voltage distribution of memory cells. Accordingly, read environment information may include the factor information 215_1 through 215_5, and the defence code selector 12a of FIG. 1 may select a defence code for finding an optimum or, alternatively, desirable level of a read voltage according to a changed threshold voltage distribution of the memory cells by using the read environment information. However, at least some example embodiments of the inventive concepts are not limited thereto, and the information storage area 215 may store more factor information that is a factor for changing a threshold voltage distribution of the memory cells.

Figure 6A:
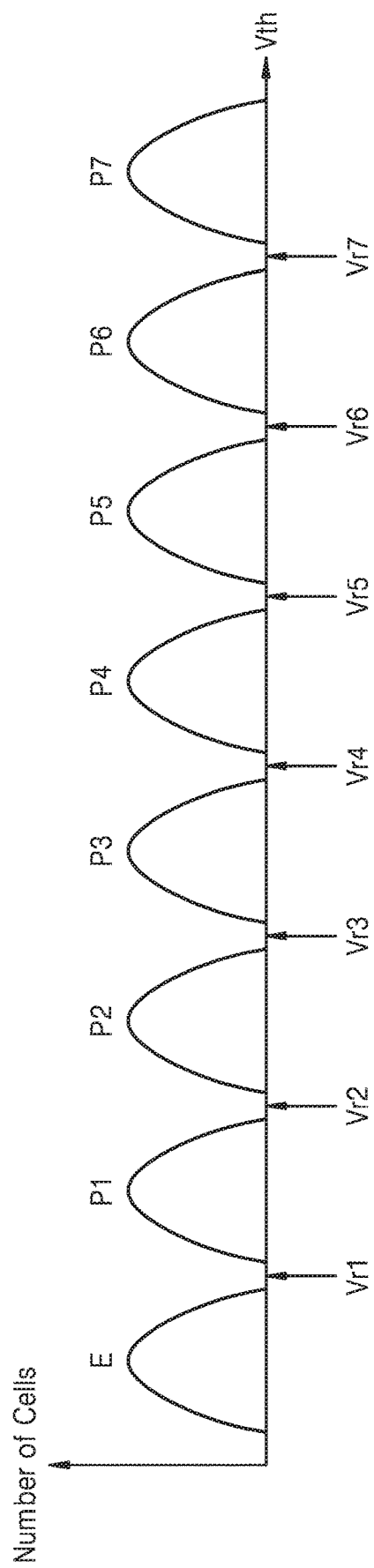
FIG. 6A is a graph showing a threshold voltage distribution of memory cells when a memory cell included in a memory cell array of FIG. 3 is a 3-bit multi-level cell.

FIG. 6A is a graph showing a threshold voltage distribution of memory cells when a memory cell included in the memory cell array 210 of FIG. 3 is a 3-bit multi-level cell.

Referring to FIG. 6A, the horizontal axis represents a threshold voltage Vth and the vertical axis represents the number of memory cells MCEL. When each of the memory cells MCEL is a 3-bit multi-level cell programmed to store 3 bits, the memory cell may have one from among an erase state and first through seventh program states P1 through P7. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through seventh read voltages Vr2 through Vr7 have a voltage level between distributions of memory cells having adjacent program states.

According to at least one example embodiment of the inventive concepts, assuming that the first read voltage Vr1 is applied, when a memory cell is turned on, data '1' may be stored, and when the memory cell is turned off, data '0' may be stored. However, at least some example embodiments of the inventive concepts are not limited thereto, and in another embodiment, assuming that the first read voltage Vr1 is applied, when a memory cell is turned on, data '0' may be stored, and when the memory cell is turned off, data '1' may be stored. As such, a logic level of data may vary according to at least one example embodiment of the inventive concepts.

Figure 6B:
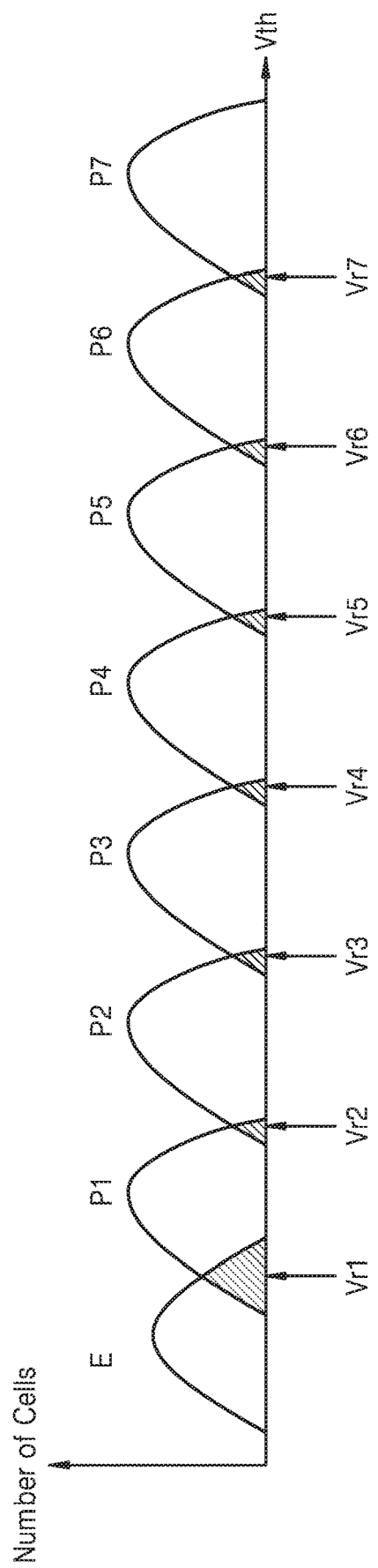
FIG. 6B is a graph showing a case where a threshold voltage of a memory cell in the graph of FIG. 6A is changed.

FIG. 6B is a graph showing a case where a threshold voltage of a memory cell in the graph of FIG. 6A is changed.

Referring to FIG. 6B, memory cells respectively programmed to the erase state E and the first through seventh program states P1 through P7 may have a changed distribution as shown in FIG. 6B according to a read environment. In FIG. 6B, memory cells belonging to hatched portions may have read errors, thereby reducing the reliability of a memory device.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the memory device.

When data is read from the memory device, a raw bit error rate (RBER) may vary according to a voltage level of a read voltage. An optimum or, alternatively, desirable voltage level of a read voltage may be determined according to a distribution pattern of the memory cells MCEL. Accordingly, as a distribution of the memory cells changes, an optimum or, alternatively, desirable voltage level of a read voltage needed to read data from the memory device may change. Accordingly, in order to rapidly determine an optimum or, alternatively, desirable level of a read voltage in consideration of a read environment of the memory device to rapidly perform a read operation, a defence code may be required to be selectively executed.

Figure 7:
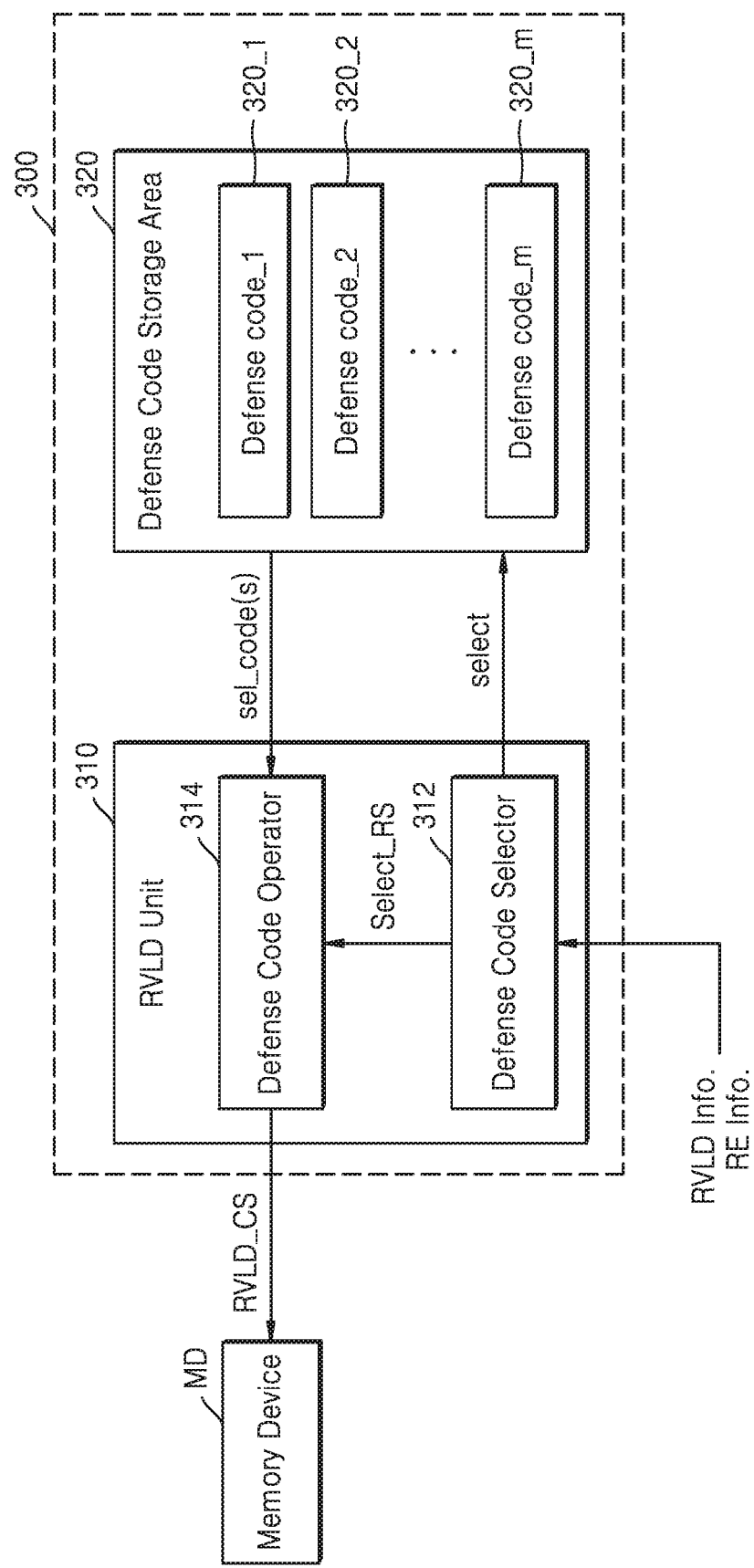
FIG. 7 is a block diagram of a memory controller according to at least one example embodiment of the inventive concepts.

FIG. 7 is a block diagram of a memory controller 300 according to at least one example embodiment of the inventive concepts.

Referring to FIG. 7, the memory controller 300 may include an RVLD unit 310 and a defence code storage area 320. The RVLD unit 310 may include a defence code selector 312 and a defence code operator 314. The defence code storage area 320 may be an area of an internal memory included in the memory controller 300, and an area of the RAM 120 or the ROM 130 of FIG. 2. The defence code selector 312 may select, as a selection defence code, at least one from among a plurality of defence codes 320_1 through 320_m based on read environment information RE Info. and read voltage level determination information RVLD Info. of a memory device MD. The defence code selector 312 may provide a result signal select_RS of the selected defence code to the defence code operator 314. The defence code operator 314 may load a selection defence code sel_code(s) from the defence code storage area 320 and may execute the selection defence code sel_code(s). The defence code operator 314 may execute the selection defence code sel_code(s), may provide a control signal RVLD_CS to the memory device MD based on the selection defence code sel_code(s), and may control the memory device MD to perform a read voltage level determination operation.

Figure 8A:
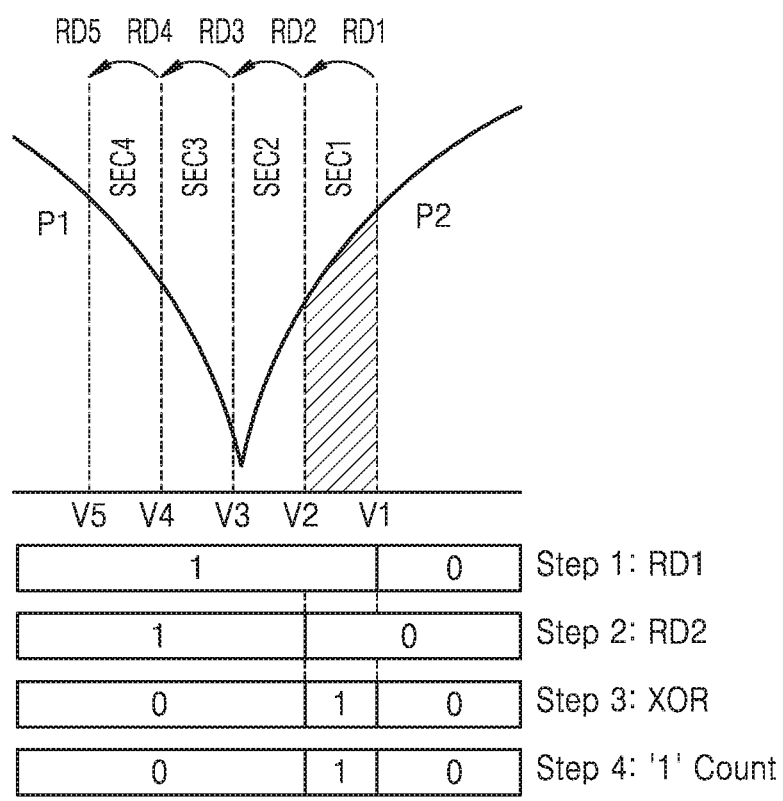
FIGS. 8A through 8C are diagrams for explaining various methods of determining a level of a read voltage by using a defence code according to at least one example embodiment of the inventive concepts.
Figure 8B:
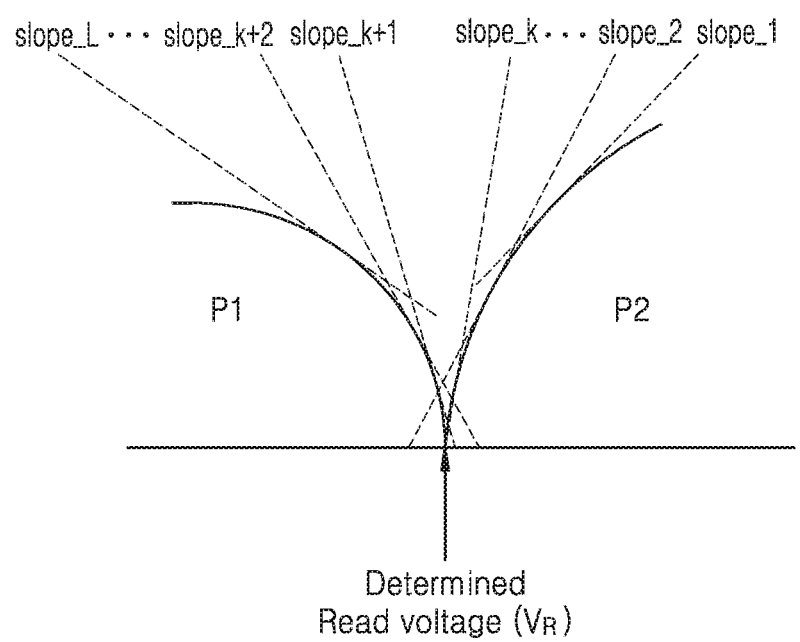
Figure 8C:
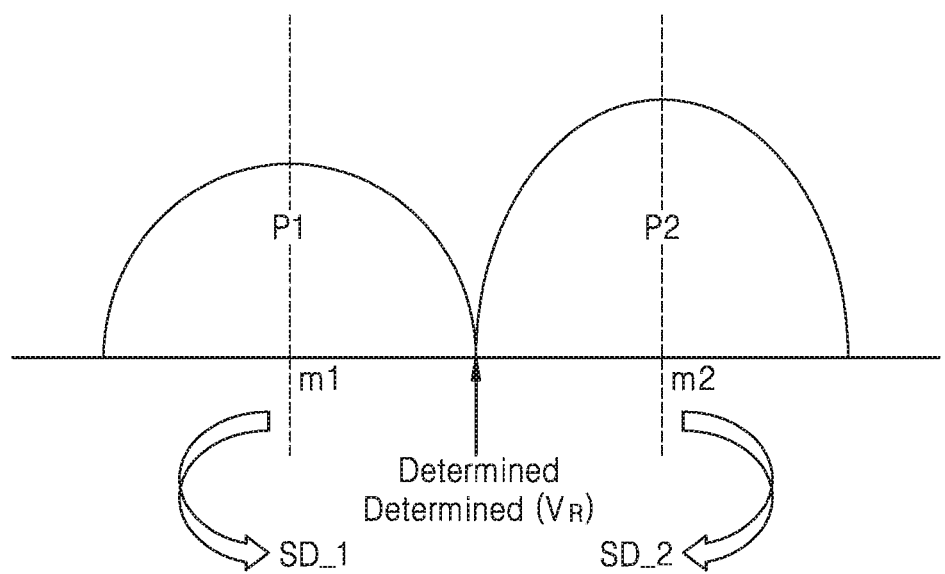

FIGS. 8A through 8C are diagrams for explaining various methods of determining a level of a read voltage by using a defence code according to at least one example embodiment of the inventive concepts.

Referring to FIGS. 7 and 8A, the defence code operator 314 may perform the following read voltage level determination operation to determine an optimum or, alternatively, desirable level of a read voltage between two adjacent states of memory cells included in the memory device MD by executing a selected first defence code. In detail, the memory controller 300 may read data from memory cells at a plurality of different voltage levels, e.g., first through fifth voltage levels V1 through V5, that are separated by a predetermined or, alternatively, desired offset from each other between two adjacent states, for example, the first program state P1 and the second program state P2, of the memory cells. The memory device MD may perform a logical operation on pieces of data read at two adjacent voltage levels from among the plurality of different voltage levels and may count the number of memory cells existing in each of a plurality of sections based on a result of the logical operation. Although the number of the plurality of different voltage levels, i.e., the first through fifth voltage levels V1 through V5, is 5, at least some example embodiments of the inventive concepts are not limited thereto and the number of a plurality of voltage levels may change in various ways. For example, a read direction of the plurality of different voltage levels may be a direction in which a voltage level decreases from the first voltage level V1 to the fifth voltage level V5. However, at least some example embodiments of the inventive concepts are not limited thereto, and a read direction of the plurality of different voltage levels may be a direction in which a voltage level increases from the fifth voltage level V5 to the first voltage level V1.

Referring to FIG. 8A, in step 1, data is read from a memory cell at the first voltage level V1 corresponding to a start voltage level. In this case, memory cells whose threshold voltage Vth is lower than the first voltage level V1 are read as '1' and memory cells whose threshold voltage Vth is higher than the first voltage level V1 are read as '0'. As such, first data RD1 read in step 1 may be temporarily stored in the memory device MD.

In step 2, data is read from a memory cell at the second voltage level V2. In this case, memory cells whose threshold voltage Vth is lower than the second voltage level V2 are read as '1' and memory cells whose threshold voltage Vth is higher than the second voltage level B are read as '0'. As such, second data RD2 read in step 2 may be temporarily stored in the memory device MD.

In step 3, the defence code operator 314 performs a logical operation by receiving the first data RD1 read at the first voltage level V1 and the second data RD2 read at the second voltage level V2. According to at least one example embodiment of the inventive concepts, the defence code operator 314 may perform an XOR operation on the first data RD1 and the second data RD2 based on a selection defence code.

For a memory cell whose threshold voltage Vth is lower than the second voltage level V2, an XOR operation result of the first and second data RD1 and RD2 is '0'. For a memory cell whose threshold voltage Vth is between the second voltage level V2 and the first voltage level V1, an XOR operation result of the first and second data RD1 and RD2 is '1'. For a memory cell whose threshold voltage Vth is higher than the first voltage level V1, an XOR operation result of the first and second data RD1 and RD2 is '0'. Accordingly, it may be determined whether a memory cell is included in a section SEC1 that is divided by two adjacent voltage levels, e.g., the first and second voltage levels V1 and V2, based on an XOR operation result of the first and second data RD1 and RD2. In detail, it may be determined that a memory cell is included in a section having an XOR operation result of '1'.

In step 4, the defence code operator 314 may count the number of '1' in an XOR operation result of each of a plurality of sections SEC1 through SEC4. Accordingly, the defence code operator 314 may detect a valley (e.g., a valley in between threshold voltage distributions of two adjacent program states) that is a voltage level corresponding to a section with a smallest number of memory cells from among the plurality of sections SEC1 through SEC4 and may determine a voltage level corresponding to the valley as an optimum or, alternatively, desirable level of a read voltage. However, at least some example embodiments of the inventive concepts are not limited thereto, and the memory device MD may be controlled by the RVLD unit 310 to perform a series of operations of FIG. 8A to determine an optimum or, alternatively, desirable voltage level.

Referring to FIGS. 7 and 8B, the defence code operator 314 may perform the following read voltage level determination operation to determine an optimum or, alternatively, desirable level of a read voltage between two adjacent states of memory cells included in the memory device MD by executing a selected second defence code. In detail, the defence code operator 314 may calculate slopes slope_1 through slope_k of a threshold voltage distribution of memory cells having the second program state P2 adjacent to the first program state P1, and may calculate slopes slope_k+1 through slope_L of a threshold voltage distribution of memory cells having the first program state P1 adjacent to the second program state P2. The RVLD unit 310 may detect a valley having a slope of a threshold voltage distribution that changes from negative to positive or from positive to negative by using the slopes slope_1 through slope_L and may determine a voltage level corresponding to the valley as an optimum or, alternatively, desirable level of a read voltage. According to at least some example embodiments of the inventive concepts, the controller 300 may control the memory device MD to perform read operations on a plurality of memory cells in order to determine the threshold voltage distributions of the memory cells having the first and second program states P1 and P2.

Referring to FIGS. 7 and 8C, the defence code operator 314 may perform the following read voltage level determination operation to determine an optimum or, alternatively, desirable level of a read voltage between two adjacent states of memory cells included in the memory device MD by executing a selected third defence code. In detail, the defence code operator 314 may calculate a standard deviation SD_1 of a threshold voltage distribution of memory cells having the first program state P1 and may calculate a standard deviation SD_2 of a threshold voltage distribution of memory cells having the second program state P2. The defence code operator 314 may detect a valley between threshold voltage distributions (e.g., threshold voltage distributions corresponding to program states P1 and P2, respectively) by using the standard deviations SD_1 and SD_2 and may determine a voltage level corresponding to the valley as an optimum or, alternatively, desirable level of a read voltage. According to at least some example embodiments of the inventive concepts, the controller 300 may control the memory device MD to perform read operations on a plurality of memory cells in order to determine the threshold voltage distributions of the memory cells having the first and second program states P1 and P2.

As described above with reference to FIGS. 8A through 8C, the defence code operator 314 may perform the same or different calculations according to executed defence codes. Also, the defence code operator 314 may determine a level of a read voltage by using various methods according to executed defence codes, and may accurately read data by using a read voltage VR having an optimum or, alternatively, desirable level. However, at least some example embodiments of the inventive concepts are not limited to FIGS. 8A through 8C, and a level of a read voltage may be determined by using more other methods according to defence codes.

Figure 9:
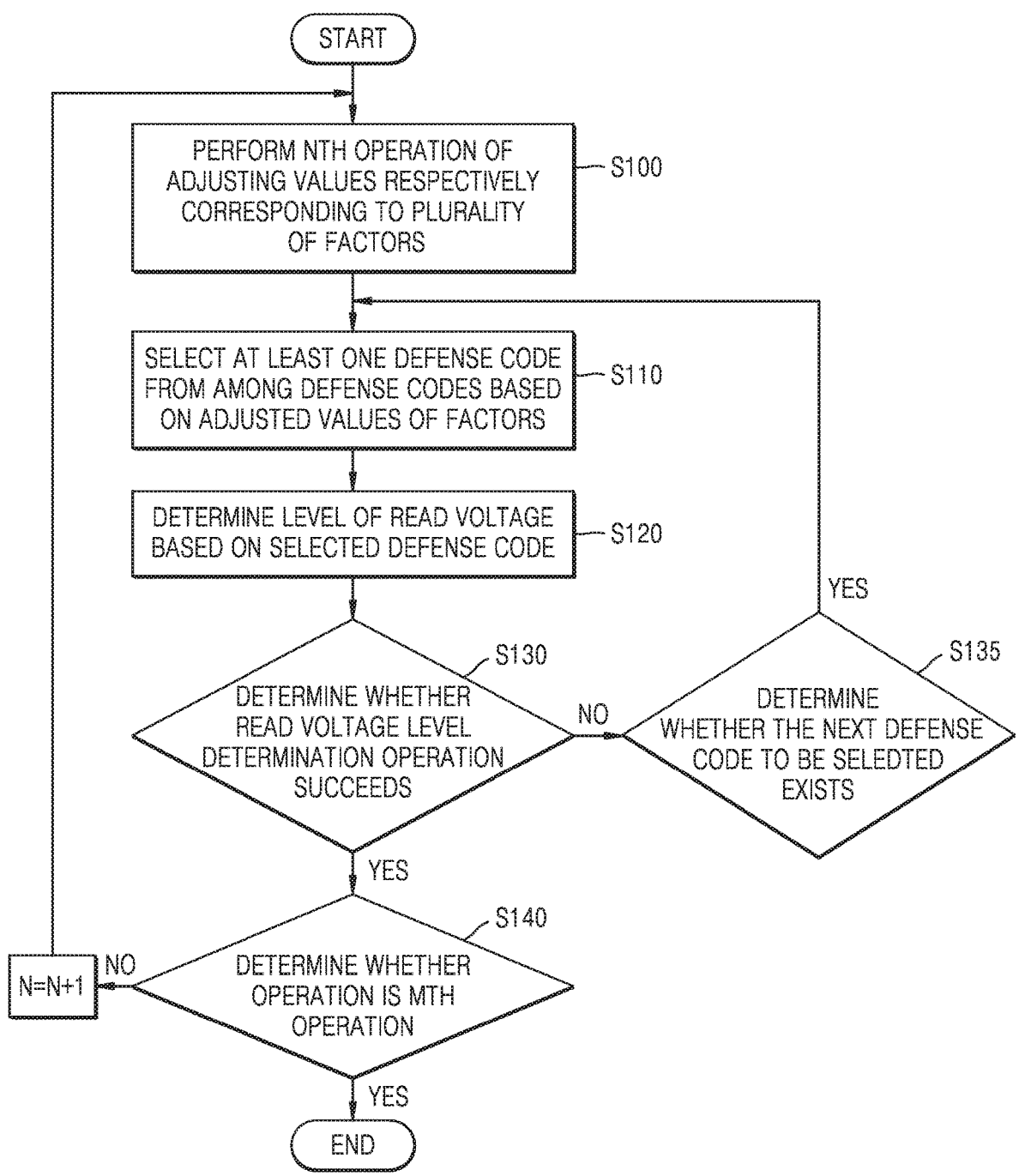
FIG. 9 is a flowchart of a method of generating read voltage level determination information according to at least one example embodiment of the inventive concepts.

FIG. 9 is a flowchart of a method of generating read voltage level determination information according to at least one example embodiment of the inventive concepts.

Referring to FIGS. 1 and 9, in operation S100, the memory controller 10 may perform an Nth operation of adjusting values of a plurality of factors for changing a threshold voltage distribution of memory cells. In operation S110, the memory controller 10 may select at least one defence code from among a plurality of defence codes based on the adjusted values of the factors. In operation S120, the memory controller 10 may determine a level of a read voltage needed to perform a read operation on the memory device 20 based on the defence code(s) selected by using the memory device 20. For example, when one defence code is selected in operation S110, the memory controller 10 can execute the one defence code alone in operation S120 to determine the read voltage level and when multiple defence codes are selected in operation S110, the memory controller 10 can execute the multiple defence codes successively in operation S120 to determine the read voltage level Next, in operation S130, the memory controller 10 may determine whether a read voltage level determination operation succeeds. The memory controller 10 may generate read voltage level determination information by using a result of the determining whether the read voltage level determination operation succeeds. When it is determined in operation S130 that the read voltage level determination operation fails, the method proceeds to operation S135. In operation S135, the memory controller 10 may determine whether the next defence code to be selected exists. For example, in operation S135, the memory controller 10 may determine whether at least one defence code other than previously selected defence codes exists. If the memory controller 10 determines the next defence code to be selected does not exist (e.g., there are no defence codes that have not been previously selected), the memory controller 10 proceeds to operation S140. Operation S140 will be discussed in greater detail below. If the memory controller 10 determines the next defence code to be selected exists (e.g., there is at least one defence code that has not been previously selected), the memory controller 10 returns to operation S110 in which at least one defence code other than the previously selected defence code is selected from among the defence codes based on re-adjusted values of the factors, and subsequent operations may be repeatedly performed. When it is determined in operation S130 that the read voltage level determination operation succeeds, the method proceeds to operation S140. In operation S140, it may be determined whether an operation of adjusting values of the plurality of factors is an Mth operation. When it is determined in operation S140 that the operation of adjusting values of the plurality of factors is an Mth operation, the read voltage level determination operation may end. When it is determined in operation S140 that the operation of adjusting values of the plurality of factors is not an Mth operation, the method proceeds to operation S150. In operation S150, N is counted up. The method returns to operation S100, and the above operations may be repeatedly performed.

Figure 10B:
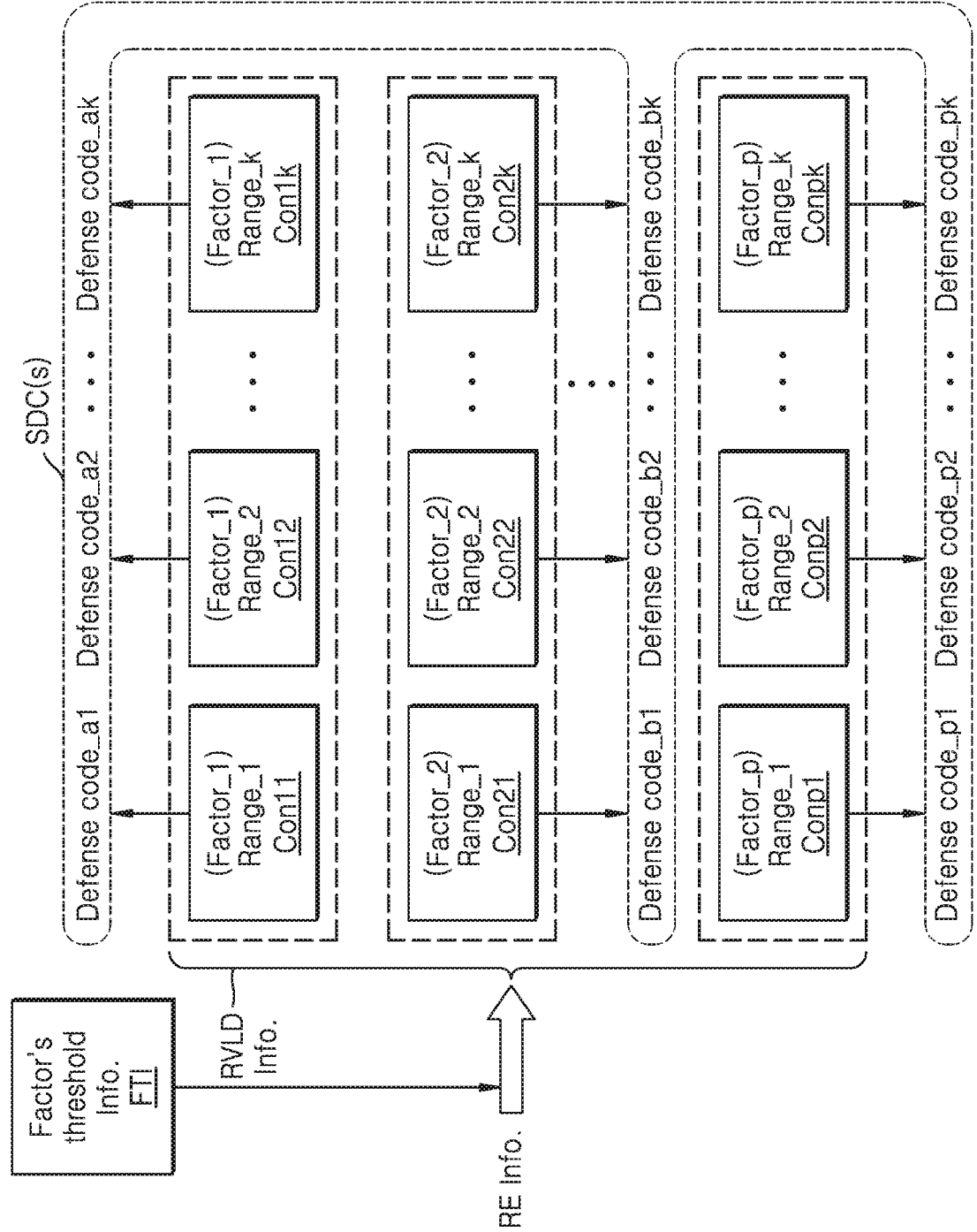
Figure 10C:
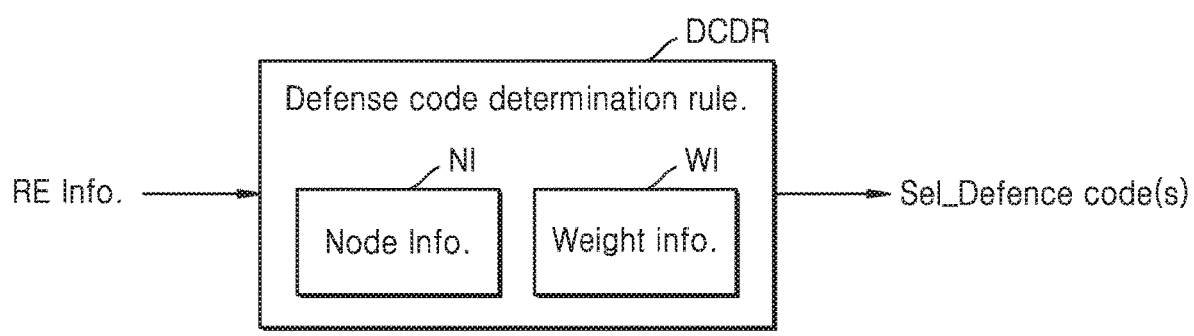

FIGS. 10A through 10C are diagrams for explaining a method of selecting at least one from among a plurality of defence codes as a selection defence code according to at least one example embodiment of the inventive concepts.

Referring to FIGS. 1 and 10A, read voltage level determination information RVLD Info. may include a plurality of read conditions, e.g., first through qth read conditions Con_1 through Con_q, and may further include at least one selection defence code SDC(s) mapped to each of the read conditions Con_1 through Con_q. For example, the first read condition Con_1 may include information FR11 indicating that a range of a value of a first factor Factor_1 is a first range Range_1, information FR21 indicating that a range of a value of a second factor Factor_2 is the first range Range_1, . . . , and information FRp1 indicating that a range of a value of a pth factor Factor_p is the first range Range_1.

The defence code selector 12a may detect a read condition by determining whether received read environment information RE_Info is included in which read condition from among the first through qth read conditions Con_1 through Con_q, and may select, as a selection defence code, at least one defence code mapped to the detected read condition (i.e., the read condition in which the read environment information RE_Info is included). For example, when values of factors of the read environment information RE_Info read by the defence code selector 12a are included in the second read condition Con_2, the defence code selector 12a may select a c-defence code Defence code_c mapped to the second read condition Con_2 as a selection defence code by referring to the read voltage level determination information RVLD Info. Furthermore, when values of factors of the read environment information RE_Info read by the defence code selector 12a are included in the qth read condition Con_q, the defence code selector 12a may select a b-defence code Defence code_b and a d-defence code Defence code_d mapped to the qth read condition Con_q as a selection defence code by referring to the read voltage level determination information RVLD Info.

Referring to FIGS. 1 and 10B, the read voltage level determination information RVLD Info. may include a plurality of read conditions Con_11 through Con_qk, and may further include information indicating at least one selection defence code SDC(s) mapped to each of the read conditions Con_11 through Con_qk. According to at least one example embodiment of the inventive concepts, each of the read conditions Con_11 through Con_qk may include at least one factor exceeding a threshold value corresponding to each of the first through pth factors Factor_1 through Factor_p and information about the amount of the at least one factor exceeding the threshold value. Also, first through kth read conditions Con_11 through Con_1k that are related to the first factor Factor_1 may indicate that the amount of the first factor Factor_1 exceeding a threshold value is included in each of first through kth ranges Range_1 through Range_k. Also, an a1-defence code Defence code_a1 through an ak-defence code Defence code_ak may be defence codes related to the first factor Factor_1. In this manner, p1th through pkth read conditions Con_p1 through Con_pk that are related to the pth factor Factor_p may indicate that the amount of the pth factor Factor_p exceeding a threshold value is included in each of the first through kth ranges Range_1 through Range_k. A p1-defence code Defence code_p1 through a pk-defence code Defence code_pk may be defence codes related to the pth factor Factor_p.

The defence code selector 12a may determine which factor exceeds a threshold value corresponding to the factor in the received read environment information RE_Info and the amount of the factor exceeding the threshold value by referring to factor threshold information FTI. The factor threshold information FTI may be stored in the information storage area 21a of FIG. 1 or an internal memory of a memory controller. For example, when a value of the second factor Factor_2 in the received read environment information RE_Info exceeds a threshold value corresponding to the second factor Factor_2 and the amount of the second factor Factor_2 exceeding the threshold value is included in the second range Range_2, the defence code selector 12a may select a b2-defence code Defence code_b2 by referring to the read voltage level determination information RVLD Info.

According to at least one example embodiment of the inventive concepts, when two or more factors in the received read environment information RE_Info exceed threshold values corresponding to the two or more factors, the defence code selector 12a may select all defence codes corresponding to the two or more factors. For example, when a value of the first factor Factor_1 and a value of the second factor Factor_2 in the read environment information RE_Info exceed threshold values corresponding to the first factor Factor_1 and the second factor Factor_2 and the amounts of the first factor Factor_1 and the second factor Factor_2 exceeding the threshold values are respectively included in the first range Range_1 and the second range Range_2, the defence code selector 12a may select the a1-defence code Defence code_a1 and the b2-defence code Defence code_b2. Although the read conditions Con_11 through Con_pk in the read voltage level determination information RVLD Info. are respectively mapped to the defence codes Defence code_a1 through Defence code_qk in FIG. 12B, at least some example embodiments of the inventive concepts are not limited thereto and two or more defence codes may be mapped.

Referring to FIGS. 1 and 10C, the read voltage level determination information RVLD Info. may include a defence code determination rule DCDR. The defence code determination rule DCDR may include node information NI about nodes through which factors included in the read environment information RE_Info are input and weight information WI about lines that connect the nodes. The defence code selector 12a may execute the defence code determination rule DCDR, and may select selection defence code(s) Sel_Defence from among a plurality of defence codes by providing the read environment information RE_Info to the defence code determination rule DCDR. In detail, the defence code selector 12a may assign weights to values corresponding to the factors included in the read environment information RE_Info based on the defence code determination rule DCDR and may select at least one selection defence code Sel_Defence code(s) from among a plurality of defence codes based on a result of the assigning of the weights.

Figure 11:
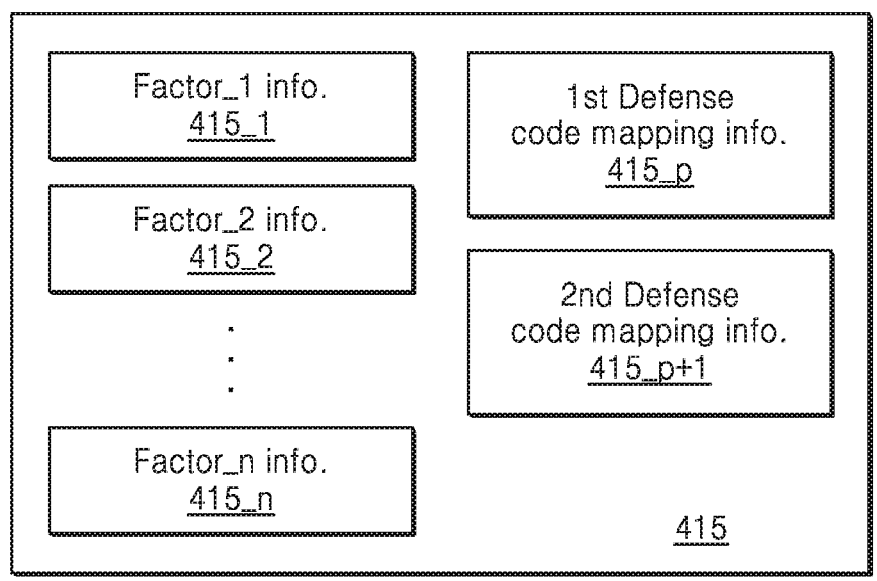
FIG. 11 is a block diagram of an information storage area according to at least one example embodiment of the inventive concepts.

FIG. 11 is a block diagram of an information storage area 415 according to at least one example embodiment of the inventive concepts.

Referring to FIG. 11, the information storage area 415 may store first factor information 415_1 through nth factor information 415_n, first defence code mapping information 415_p, and second defence code mapping information 415_p+1. When compared to the information storage area 215 of FIG. 5A, the information storage area 415 may further include the second defence code mapping information 415_p+1. Read voltage level determination information may include the first defence code mapping information 415_p and the second defence code mapping information 415_p+1, and the first defence code mapping information 415_p corresponds to the defence code mapping information 215_p of FIG. 5A and thus will not be explained in detail. The second defence code mapping information 415_p+1 may be used to determine a level of a read voltage needed to perform an error correction operation. That is, the RVLD unit 152 of FIG. 2 may select at least one selection defence code from among a plurality of defence codes by using the first factor information 415_1 through the nth factor information 415_n and the second defence code mapping information 415_p+1 in order to determine a level of a read voltage related to a hard decision method or a soft decision method needed by the error correction circuit 160 to perform an error correction method on read data. According to at least one example embodiment of the inventive concepts, the first defence code mapping information 415_p and the second defence code mapping information 415_p+1 may be different from each other. In detail, defence codes included in the first defence code mapping information 415_p and defence codes included in the second defence code mapping information 415_p+1 may be different from each other. However, at least some example embodiments of the inventive concepts are not limited thereto, and the first defence code mapping information 415_p and the second defence code mapping information 415_p+1 may be the same.

Figure 12A:
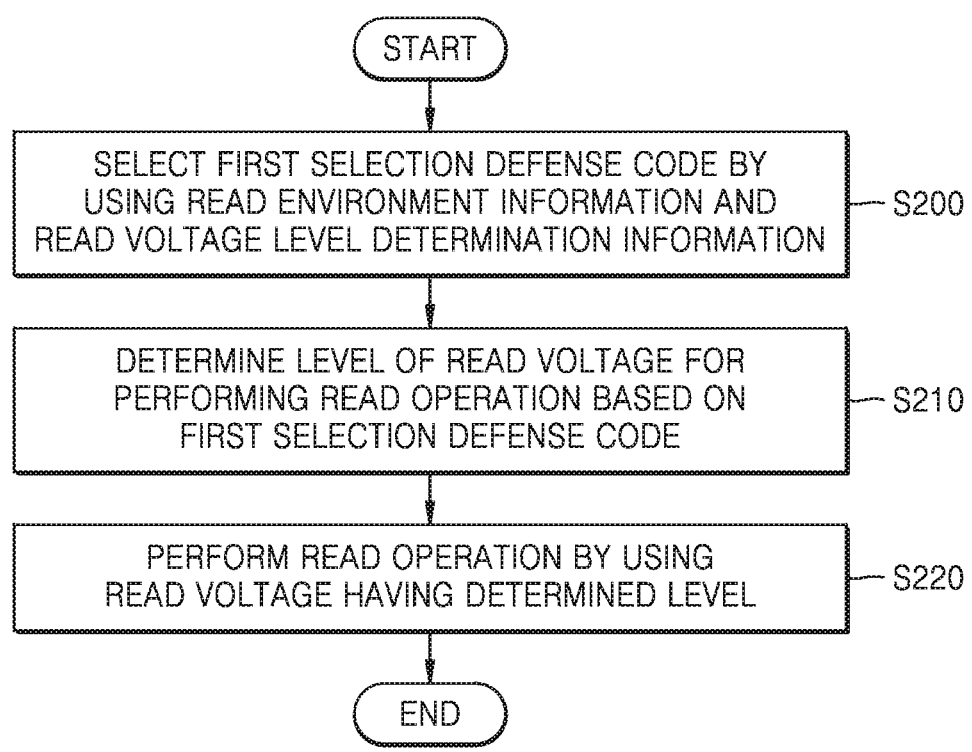
FIGS. 12A and 12B are flowcharts for explaining an operation method of the memory controller of FIG. 2 according to at least one example embodiment of the inventive concepts.
Figure 12B:
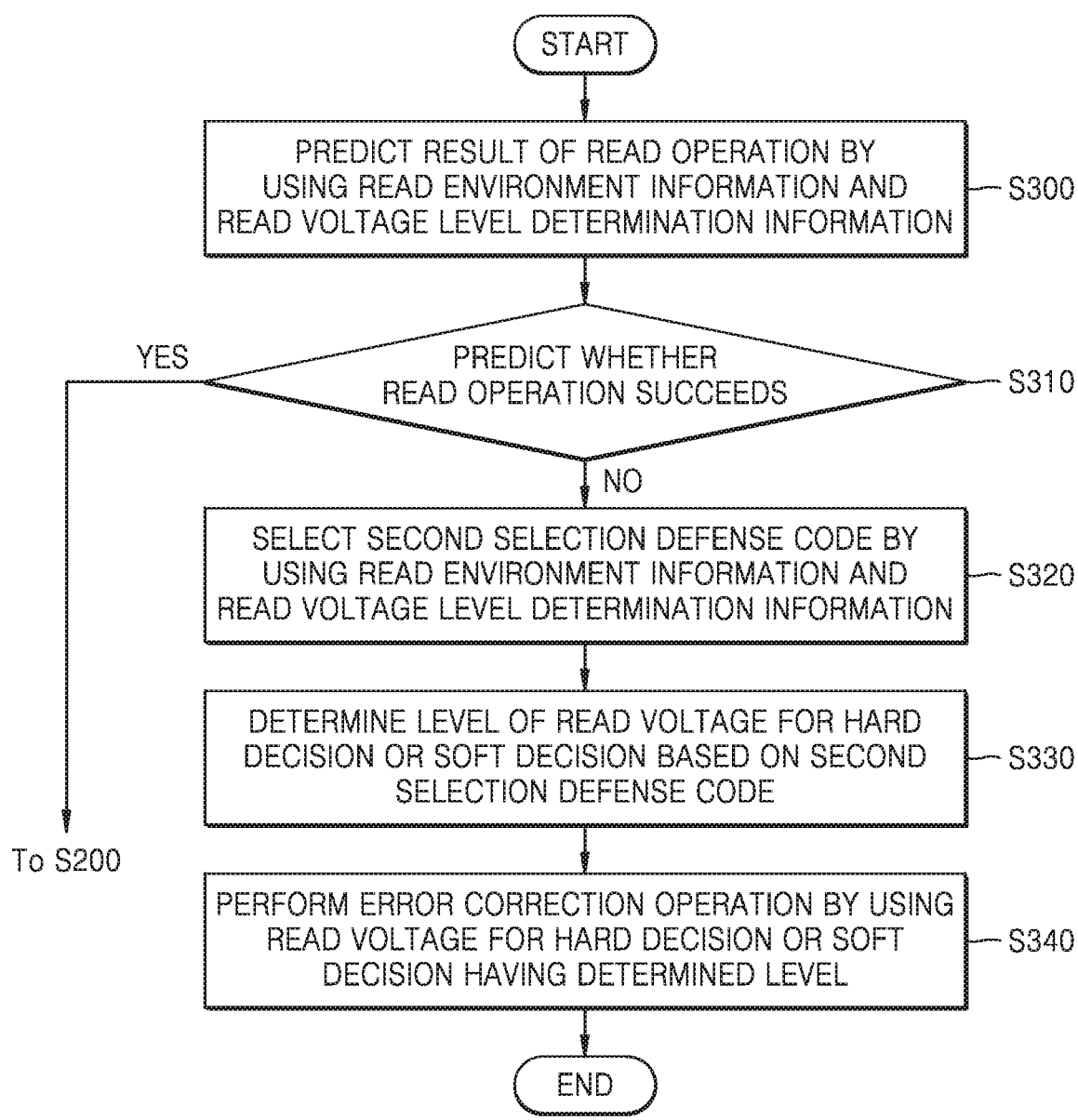
Figure 13:
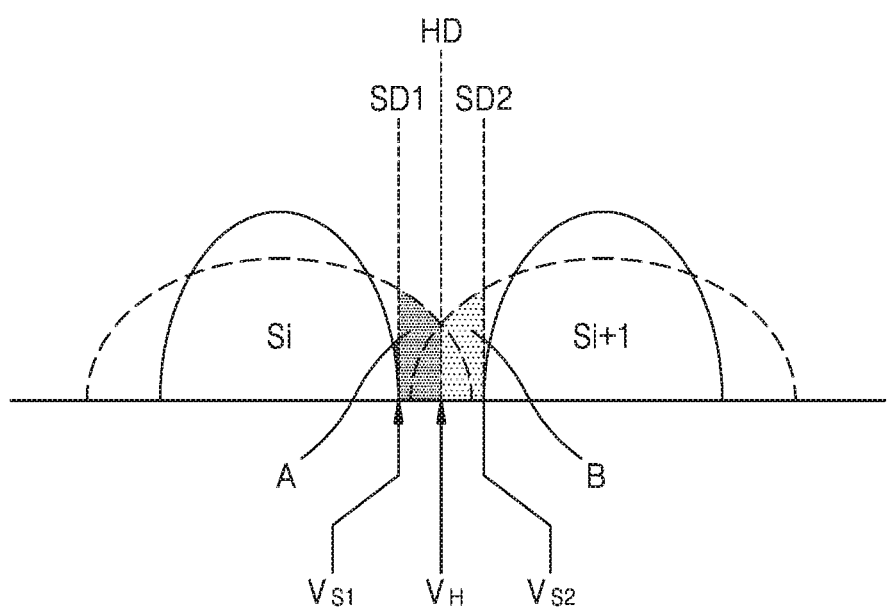
FIG. 13 is a diagram for explaining an operation of determining a level of a read voltage needed for error correction according to at least one example embodiment of the inventive concepts.

FIGS. 12A and 12B are flowcharts for explaining an operation method of the memory controller 100 of FIG. 2 according to at least one example embodiment of the inventive concepts. FIG. 13 is a diagram for explaining an operation of determining a level of a read voltage needed for error correction according to at least one example embodiment of the inventive concepts.

Referring to FIGS. 2 and 12A, in operation S200, the RVLD unit 152 may select a first selection defence code from among a plurality of defence codes by using read environment information and read voltage level determination information. In operation S210, the RVLD unit 152 may execute the first selection defence code and may determine a level of a read voltage for performing a read operation based on the first selection defence code by using a memory device. Next, in operation S220, the memory controller 100 may perform a read operation on the memory device by using a read voltage having the determined level (e.g., the determined read voltage level).

Referring to FIGS. 2 and 12B, in operation S300, the RVLD unit 152 may predict a result of a read operation by using read environment information and read voltage level determination information. In detail, in operation S300, when a selection defence code may not be selected from among a plurality of defence codes by using the read environment information and the read voltage level determination information, the RVLD unit 152 may predict, in operation S310, that the read operation is to fail. Further, in operation S300, when a selection defence code may be selected, the RVLD unit 152 may predict, in operation S310, that the read operation is to succeed. For example, according to at least some example embodiments of the inventive concepts, if all the defence codes have been executed but the appropriate read voltage level can't be determined, the RVLD unit 152 predicts that the read operation is failed. When it is predicted in operation S310 that the read operation is to succeed, the operation methods proceeds to operation S200 of FIG. 12A and operation S200 may be performed. When it is predicted in operation S310 that the read operation is to fail, the operation method proceeds to operation S320. In operation S320, the RVLD unit 152 may select a second selection defence code from among a plurality of defence codes by using the read environment information and the read voltage level determination information.

Further referring to FIG. 13, data states of data programmed to a memory cell have to be spaced by a predetermined or, alternatively, desired voltage interval from adjacent data states Si and Si+1 so that a sufficient read margin is secured. When a threshold voltage distribution is formed as marked by a dashed line, a hard decision read voltage VH for a hard decision operation HD may be needed and soft decision read voltages VS1 and VS2 for soft decision operations SD1 And SD2 may be needed. Accordingly, in operation S330, the RVLD unit 152 may determine a level of a read voltage for hard decision or soft decision based on the second selection defence code. In operation S340, the error correction circuit 160 may perform an error correction operation by using a read voltage for hard decision or soft decision having the determined level (e.g., the determined read voltage level).

Figure 14:
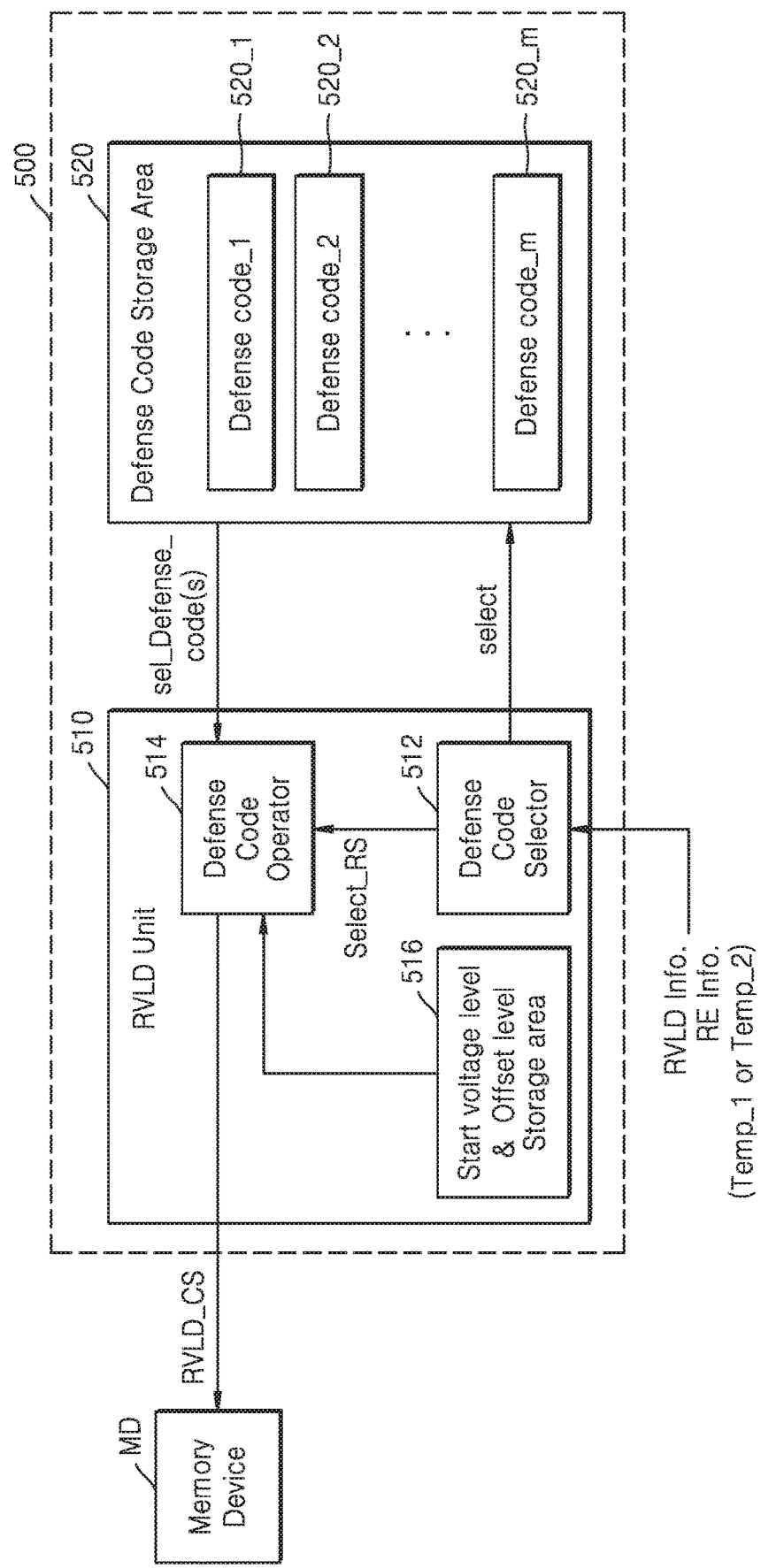
FIG. 14 is a block diagram for explaining an operation of a memory controller according to at least one example embodiment of the inventive concepts.
Figure 15A:
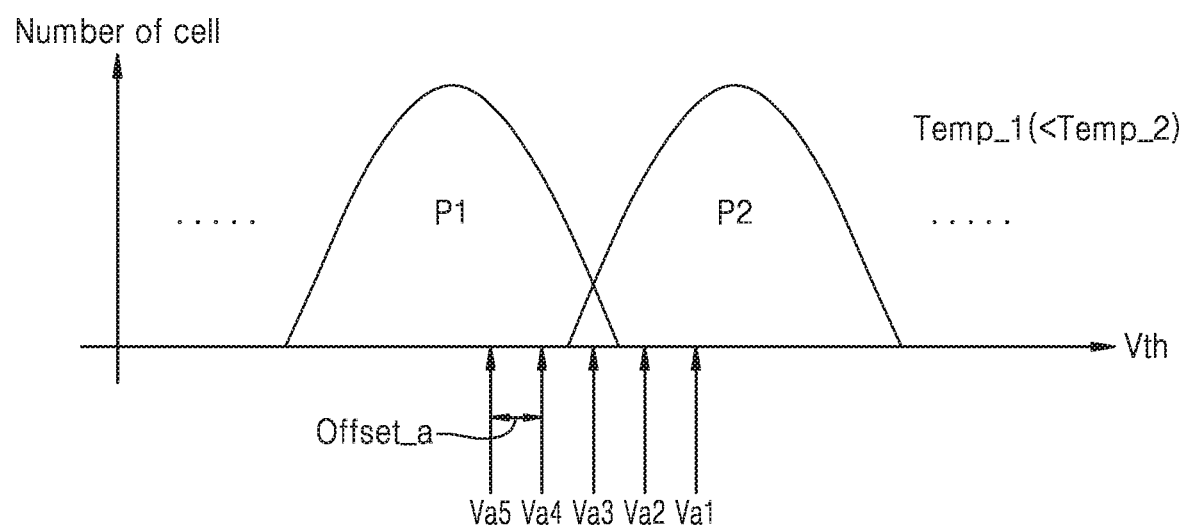
FIGS. 15A and 15B are graphs for explaining an operation of determining a level of a read voltage when different defence codes are executed according to at least one example embodiment of the inventive concepts.
Figure 15B:
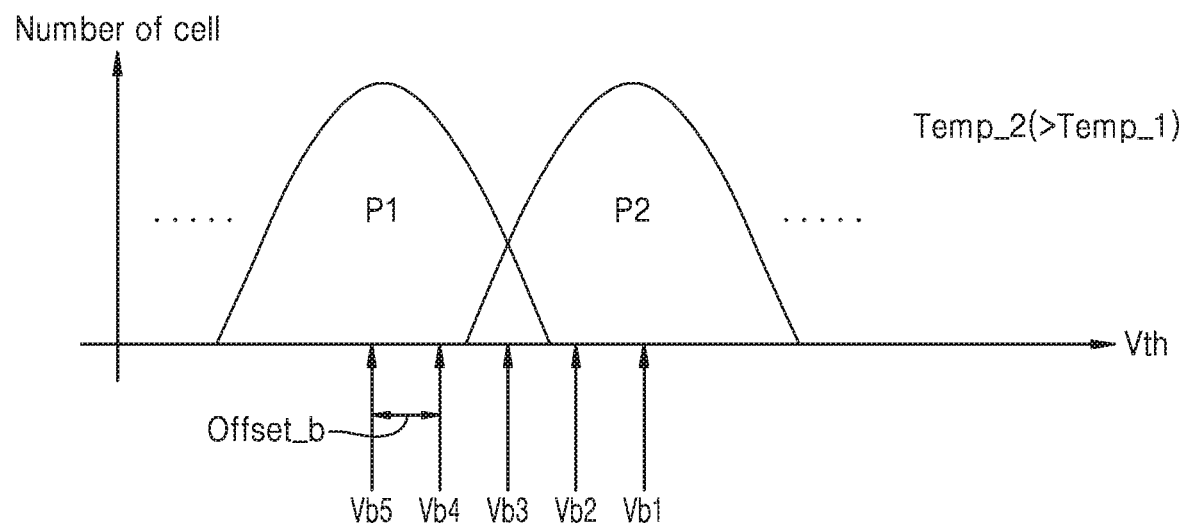

FIG. 14 is a block diagram for explaining an operation of a memory controller 500 according to at least one example embodiment of the inventive concepts. FIGS. 15A and 15B are graphs for explaining an operation of determining a level of a read voltage when different defence codes are executed according to at least one example embodiment of the inventive concepts.

Referring to FIG. 14, the memory controller 500 may include an RVLD unit 510 and a defence code storage area 520. The RVLD unit 510 may include a defence code selector 512, a defence code operator 514, and a start voltage level and offset level storage area 516. However, at least some example embodiments of the inventive concepts are not limited thereto, and the start voltage level and offset level storage area 516 may be an area of an internal memory included in the memory controller 300, or an area of the RAM 120 or the ROM 130 of FIG. 2. A method performed by the RVLD unit 510 to determine a level of a read voltage by selecting a selection defence code from among defence codes by using the method of FIG. 8A in consideration of only a temperature factor in the read environment information RE Info. will now be explained.

The defence code selector 512 may select, as a selection defence code, at least one from among a plurality of defence codes 520_1 through 520_m based on the read environment information RE Info. about the memory device MD and the read voltage level determination information RVLD Info.

Further referring to FIGS. 15A and 15B, According to at least one example embodiment of the inventive concepts, a variation in a threshold voltage distribution (or a threshold voltage distribution shifting amount) of memory cells may vary according to a temperature. That is, FIG. 15A illustrates a threshold voltage distribution of memory cells when a temperature of the memory device MD is a first temperature Temp_1 during a read operation on the memory device MD. FIG. 15B illustrates a threshold voltage distribution of memory cells when a temperature of the memory device MD is a second temperature Temp_2. When the threshold voltage distribution of the memory cells of FIG. 15B and the threshold voltage distribution of the memory cells of FIG. 15A are compared with each other, since the second temperature Temp_2 is higher than the first temperature Temp_1, a variation in the threshold voltage distribution of the memory cells of FIG. 15B may be greater than a variation in the threshold voltage distribution of the memory cells of FIG. 15A. In detail, the threshold voltage distribution of the memory cells at the second temperature Temp_2 may be shifted more leftward than the threshold voltage distribution of the memory cells at the first temperature Temp_1, and a threshold voltage distribution of the first program state P1 and a threshold voltage distribution of the second program state P2 may overlap much more.

The defence code selector 512 may select an appropriate selection defence code in consideration of a variation in a threshold voltage distribution of memory cells according to a temperature by using the read environment information RE Info. and the read voltage level determination information RVLD Info. In detail, as shown in FIG. 15A, when a temperature factor of the read environment information RE Info. is the first temperature Temp_1, the defence code selector 512 may select an a-defence code that determines a level of a read voltage by using a first start voltage Va1 and a first offset voltage Offset_a. Also, as shown in FIG. 15B, when a temperature factor of the read environment information RE Info. is the second temperature Temp_2, the defence code selector 512 may select a b-defence code that determines a level of a read voltage by using a second start voltage Vb1 and a second offset voltage Offset_b. For example, the first start voltage Va1 may be greater than the second start voltage Vb2, and the first offset voltage Offset_a may be less than the second offset voltage Offset_b.

When the a-defence code and the b-defence code are executed, the defence code operator 514 may determine a level of a read voltage by referring to a needed start voltage level and a needed offset level from the start voltage level and offset level storage area 516.

Figure 16:
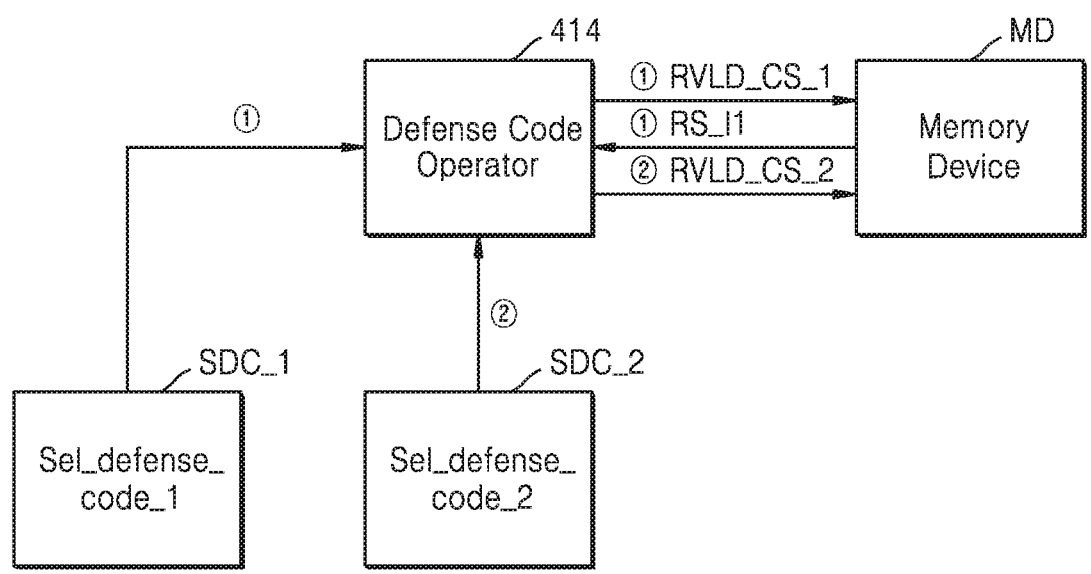
FIG. 16 is a block diagram for explaining an operation performed by a defence code operator to determine a level of a read voltage by using a plurality of selection defence codes according to at least one example embodiment of the inventive concepts.

FIG. 16 is a block diagram for explaining an operation performed by a defence code operator 414 to determine a level of a read voltage by using a plurality of selection defence codes according to at least one example embodiment of the inventive concepts.

Referring to FIG. 16, the defence code operator 414 may determine a level of a read voltage needed for a read operation on the memory device MD by executing a first selection defence code SDC_1 and a second selection defence code SDC_2 that are selected.

First, the defence code operator 414 may execute the first selection defence code SDC_1 and may provide a first control signal RVLD_CS_1 to the memory device MD based on the first selection defence code SDC_1. The memory device MD may perform an operation of determining a level of a read voltage in response to the first control signal RVLD_CS_1, and may provide operation result information RS_I1 to the defence code operator 414. The defence code operator 414 may execute the second selection defence code SDC_2, and may provide a second control signal RVLD_CS_2 based on the operation result information RS_I1 and the second selection defence code SDC_2. For example, according to at least some example embodiments of the inventive concepts, the first selected defence code and the second selected defence code can be successively executed to determine the read voltage level. The memory device MD may perform an operation of determining a level of a read voltage in response to the second control signal RVLD_CS_2.

As such, when a plurality of selection defence codes, e.g., the first and second selection defence codes SDC_1 and SDC_2, are executed, the defence code operator 414 may determine a level of a read voltage by using operation result information based on the first and second selection defence codes SDC_1 and SDC_2.

Figure 17:
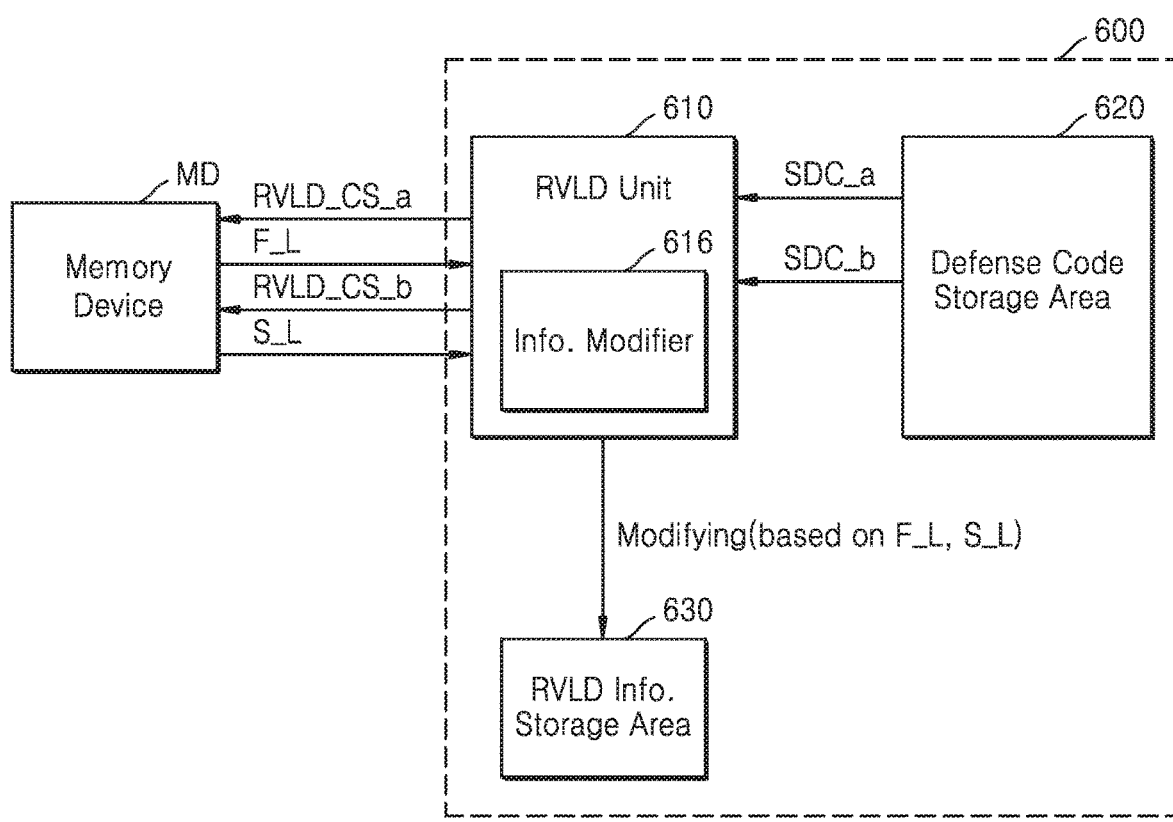
FIG. 17 is a block diagram for explaining an operation performed by a memory controller to update read voltage level determination information according to at least one example embodiment of the inventive concepts.

FIG. 17 is a block diagram for explaining an operation performed by a memory controller 600 to update read voltage level determination information according to at least one example embodiment of the inventive concepts.

The memory controller 600 may include an RVLD unit 610, a defence code storage area 620, and a read voltage level determination information storage area 630. The RVLD unit 610 may further include an information modifier 616. When the RVLD unit 610 performs an operation of determining a level of a read voltage by controlling the memory device MD, the information modifier 616 may update the read voltage level determination information RVLD Info. by using an operation result.

According to at least one example embodiment of the inventive concepts, the RVLD unit 60 may select and execute an a-selection defence code SDC_a by using read environment information and the read voltage level determination information RVLD Info. and may provide a first control signal RVLD_CS_a to the memory device MD based on the a-selection defence code SDC_a. The memory device MD may perform a read voltage level determination operation in response to the first control signal RVLD_CS_a. When the read voltage level determination operation fails, the memory device MD may provide failure log information F_L to the RVLD unit 610. The RVLD unit 610 may re-select and execute a b-selection defence code SDC_b by using the read environment information and the read voltage level determination information RVLD Info., and may provide a second control signal RVLD_CS_b to the memory device MD based on the b-selection defence code SDC_b. The memory device MD may perform a read voltage level determination operation in response to the second control signal RVLD_CS_b. When the read voltage level determination operation succeeds, the memory device MD may provide success log information S_L to the RVLD unit 610. Next, the memory controller 600 may control a read operation on the memory device MD by using a read voltage having a determined level (e.g., the determined read voltage level).

According to at least one example embodiment of the inventive concepts, the information modifier 616 may modify the read voltage level determination information RVLD Info. by using the failure log information F_L and the success log information S_L. The failure log information F_L may include read environment information when the failed read voltage level determination operation is performed and information about a selection defence code selected and executed in this case. The success log information S_L may include read environment information when the succeeded read voltage level determination operation is performed and information about a selection defence code selected and executed in this case.

As such, since the information modifier 616 updates the read voltage level determination information RVLD Info. according to a result (i.e., a failure or a success) of a read voltage level determination operation, the risk of a failure when a read voltage level determination operation is performed by executing a selection defence code may be greatly reduced.

Figure 18:
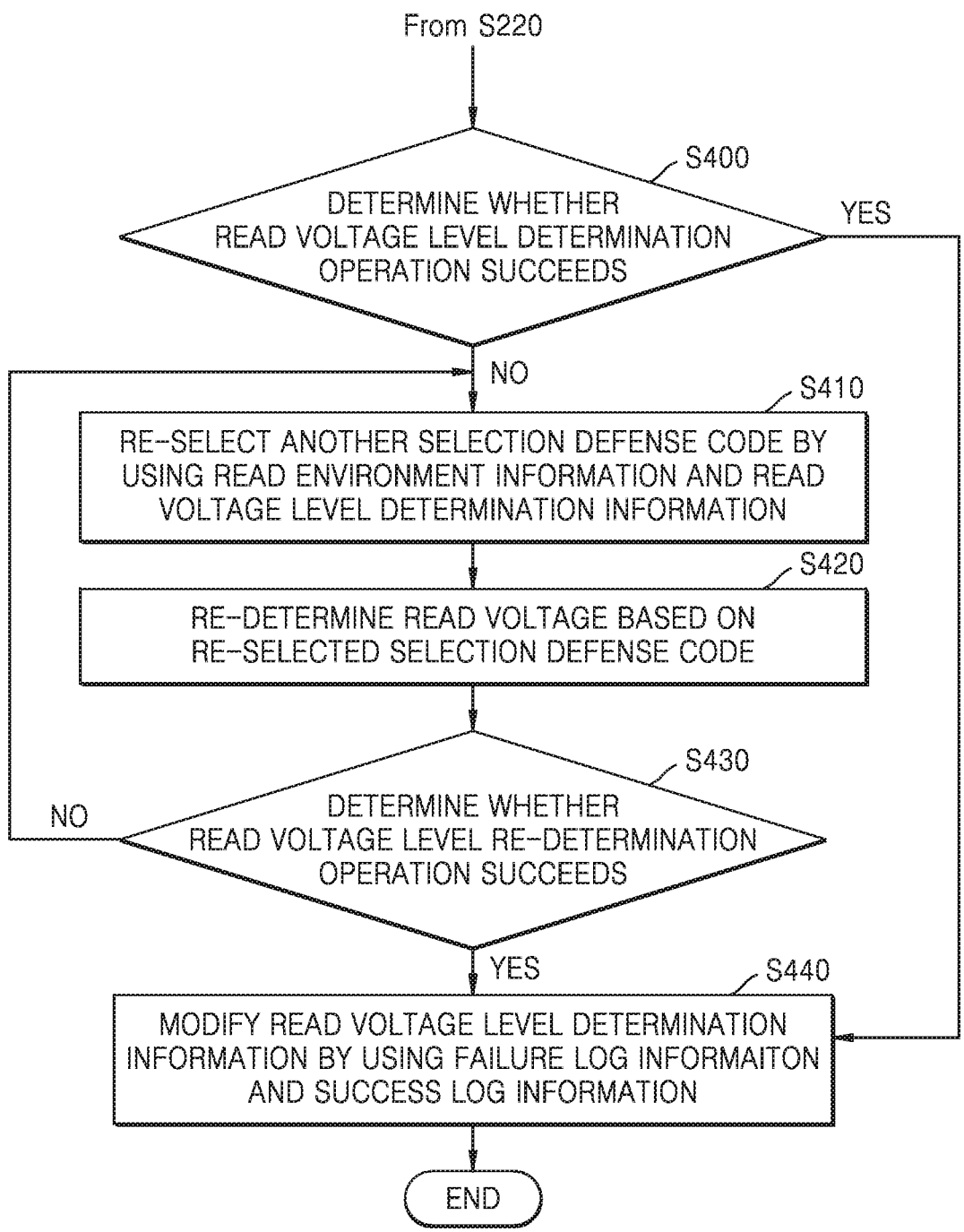
FIG. 18 is a flowchart for explaining an operation performed by a memory controller to update read voltage level determination information according to at least one example embodiment of the inventive concepts.

FIG. 18 is a flowchart for explaining an operation performed by a memory controller to update read voltage level determination information according to at least one example embodiment of the inventive concepts.

Referring to FIG. 18, in operation S400, after operation S210 of FIG. 12A, it may be determined whether a read voltage level determination operation succeeds. When it is determined in operation S400 that the read voltage level determination operation fails, the operation proceeds to operation S410. In operation S410, another selection defence code may be re-selected by using read environment information and read voltage level determination information. In operation S420, an operation of re-determining the level of a read voltage may be performed based on the re-selected selection defence code. In operation S430, it may be determined whether a read voltage level re-determination operation succeeds. When it is determined in operation S430 that the read voltage level re-determination operation fails, the operation may return to operations S410 and S420. When it is determined in operation S430 that the read voltage level re-determination operation succeeds, the operation proceeds to operation S440. In operation S440, the read voltage level determination information may be modified by using failure log information and success log information.

Figure 19:
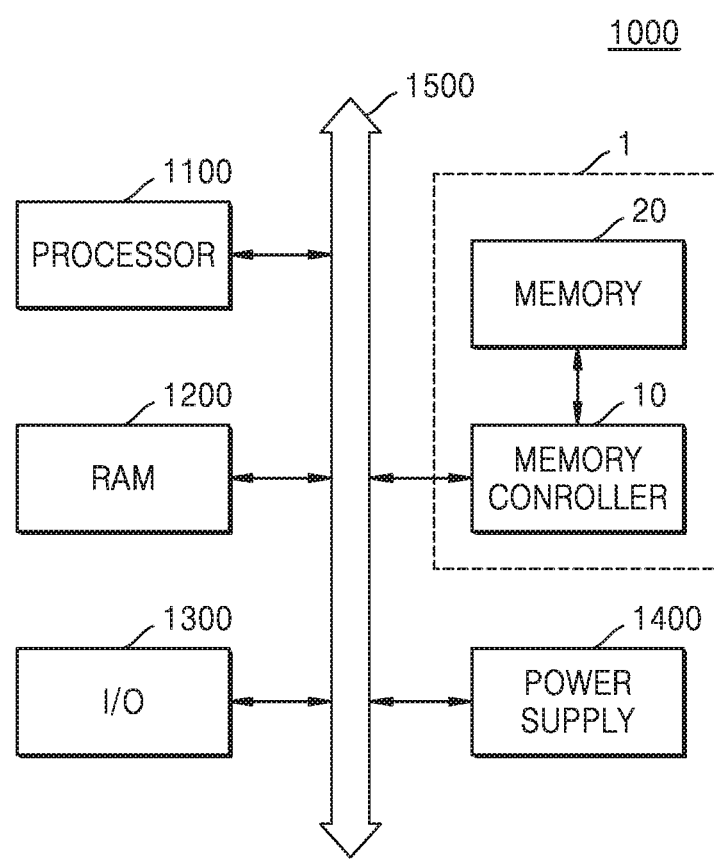
FIG. 19 is a block diagram of a computing system including the memory system according to embodiments.

FIG. 19 is a block diagram of a computing system 1000 including the memory system 1 according to embodiments.

Referring to FIG. 19, the computing system 1000 may include a processor 1100, a RAM 1200, an input/output device 1300, a power supply device 1400, and the memory system 1. The computing system 1000 may further include ports that may communicate with a video card, a sound card, a memory card, or a USB device, or other electronic devices. The computing system 1000 may be a portable electronic device such as a personal computer, a notebook computer, a mobile phone, a personal digital assistant (PDA), or a camera.

The processor 1100 may perform specific calculations or tasks. According to at least one example embodiment of the inventive concepts, the processor 1100 may be a microprocessor or a central processing unit (CPU). The processor 1100 may communicate with the RAM 1200, the input/output device 1300, and the memory system 1 via a bus 1500 such as an address bus, a control bus, or a data bus According to at least one example embodiment of the inventive concepts, the processor 1100 may be connected to an expansion bus such as a peripheral component interconnect (PCI) bus.

The RAM 1200 may store data needed to operate the computing system 1000. For example, the RAM 1200 may include a dynamic RAM (DRAM), a mobile DRAM, a static RAM (SRAM), a phase-change RAM (PRAM), a ferroelectric RAM (FRAM), a resistive RAM (RRAM), and/or a magnetoresistive RAM (MRAM).

The input/output device 1300 may include an input unit such as a keyboard, a keypad, or a mouse and an output unit such as a printer or a display. The power supply device 1400 may supply an operating voltage needed to operate the computing system 1000.

The memory system 1 according to the present embodiment may be combined with an application chipset, a camera image processor, or a mobile DRAM and may be used as a storage device of an information processing device that may exchange a large amount of data.

According to at least one example embodiment of the inventive concepts, the memory controller 10 may select at least one selection defence code from among a plurality of defence codes by using read environment information and read voltage level determination information during a read operation on the memory device 20, and may determine an optimum or, alternatively, desirable level of a read voltage by executing the at least one selection defence code.

According to at least some example embodiments of the inventive concepts, memory controllers 100, 300, 500 and 600 are each example implementations of the memory controller 10 of FIGS. 1 and 19. According to at least some example embodiments of the inventive concepts, memory device 200 and memory device MD are example implementations of the memory device 20 of FIG. 1.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A read operation method of a nonvolatile memory, the read operation method comprising:
   selecting at least a first selection defence code from among a plurality of defence codes by using read voltage level determination information and read environment information, the read environment information including values respectively corresponding to a plurality of factors, the plurality of defence codes being executable code;
   determining a level of a read voltage for performing a read operation based on the first selection defence code; and
   performing the read operation by using the read voltage having the determined level.

2. The read operation method of claim 1, further comprising:
   generating the read voltage level determination information by performing a training operation.

3. The read operation method of claim 2, wherein,
   the training operation includes a plurality of loop operations, and
   each of the plurality of loop operations comprises:
      adjusting the values respectively corresponding to the plurality of factors;
      selecting at least one defence code from among the plurality of defence codes based on the adjusted values respectively corresponding to the plurality of factors;
      determining a first level of the read voltage based on the at least one defence code;
      performing the read operation by using the read voltage having the determined first level and determining whether the read operation succeeds; and
      accumulating the read voltage level determination information by using a result of the determining whether the read operation succeeds.

4. The read operation method of claim 1, wherein,
   the read voltage level determination information includes a defence code selection rule, and
   the selecting of the first selection defence code from among the plurality of defence codes comprises:
      assigning weights to the values respectively corresponding to the plurality of factors based on the defence code selection rule; and
      selecting the first selection defence code from among the plurality of defence codes based on a result of the assigning of the weights.

5. The read operation method of claim 1, wherein,
   the read voltage level determination information includes defence code mapping information indicating at least one defence code mapped to each of a plurality of read conditions according to the values respectively corresponding to the plurality of factors, and the selecting of the first selection defence code from among the plurality of defence codes comprises:
detecting a read condition corresponding to the read environment information from among the plurality of read conditions; and
selecting the at least one defence code mapped to the detected read condition as the first selection defence code.

6. The read operation method of claim 5, wherein each of the plurality of read conditions includes at least one factor exceeding a threshold value corresponding to each of the plurality of factors from among the plurality of factors and information about an amount of the at least one factor exceeding the threshold value.

7. The read operation method of claim 1, wherein the plurality of factors include at least one from among a temperature of a memory device, a retention time of data programmed to the memory device, a program/erase (P/E) cycle of the memory device, a time stamp according to an operation of the memory device, and a number of off cells according to a read operation on the memory device.

8. The read operation method of claim 1, further comprising:
updating the read voltage level determination information by using a result of an operation of determining the level of the read voltage.

9. The read operation method of claim 8, further comprising:
when the operation of determining the level of the read voltage fails,
selecting a new first selection defence code from among the plurality of defence codes by using the read environment information and the read voltage level determination information; and
re-determining the level of the read voltage based on the new first selection defence code.

10. The read operation method of claim 9, wherein, when the operation of re-determining the level of the read voltage succeeds,
the updating of the read voltage level determination information by using the result of the operation of determining the level of the read voltage includes modifying the read voltage level determination information by using failure log information of the operation of determining the level of the read voltage and success log information of the operation of re-determining the level of the read voltage.

11. The read operation method of claim 1, wherein, when the selecting includes selecting a plurality of first selection defence codes,
the determining of the level of the read voltage includes performing a first operation of determining the level of the read voltage based on any one from among the plurality of first selection defence codes and performing a second operation of determining the level of the read voltage by using a result of the first operation based on another one from among the plurality of first selection defence codes.

12. The read operation method of claim 1, further comprising:
predicting a result of the read operation based on the read environment information and the read voltage level determination information.

13. The read operation method of claim 12, wherein the predicting of the result of the read operation includes predicting that the read operation is to fail when the first selection defence code is not selected by using the read environment information and the read voltage level determination information.

14. The read operation method of claim 13, further comprising:
skipping,
the selecting of the first selection defence code,
the determining of the level of the read voltage based on the first selection defence code, and
the performing of the read operation by using the read voltage having the determined level,
when it is predicted that the read operation is to fail.

15. An operation method of a memory system comprising a memory device and a memory controller for controlling the memory device, the operation method comprising:
collecting, by the memory controller from the memory device, read environment information comprising values respectively corresponding to a plurality of factors in response to a read request received from outside of the memory controller;
selecting, by the memory controller, at least one selection defence code from among a plurality of defence codes by using read voltage level determination information and the read environment information, the plurality of defence codes being executable code;
determining, by the memory controller, a level of a read voltage by controlling the memory device based on the at least one selection defence code; and
controlling, by the memory controller, a read operation on the memory device based on a result of a read voltage level determination operation, wherein the controlling is performed by the memory controller.

16. The operation method of claim 15, wherein,
the memory device includes a plurality of memory blocks, and
the operation method further comprises:
separately generating the read environment information and the read voltage level determination information according to the plurality of memory blocks.

17. A memory controller for controlling a memory operation on a memory device, the memory controller comprising:
a memory configured to store programs related to defence code selection and read voltage level determination information; and
a processor connected to the memory and configured to execute the programs stored in the memory in order to select at least one selection defence code from among a plurality of defence codes by using the read voltage level determination information and read environment information comprising values respectively corresponding to a plurality of factors collected from the memory device, in response to a read request received from outside of the processor, the plurality of defence codes being executable code.

18. The memory controller of claim 17, wherein the read voltage level determination information comprises at least one from among a defence code selection rule generated by learning and defence code mapping information indicating at least one defence code mapped to each of a plurality of read conditions according to the values respectively corresponding to the plurality of factors.

19. The memory controller of claim 17, wherein the processor is further configured to execute the at least one selection defence code in order to determine a level of a read voltage for performing a read operation on the memory device based on the at least one selection defence code.

20. The memory controller of claim 19, wherein the processor is further configured to control the read operation on the memory device by using the read voltage having the determined level and to update the read voltage level determination information based on a result of the read operation.

* * * * *